(12) United States Patent
Fahimi et al.

(10) Patent No.: US 9,366,732 B2
(45) Date of Patent: Jun. 14, 2016

(54) ESTIMATION OF STATE-OF-HEALTH IN BATTERIES

(75) Inventors: Babak Fahimi, Arlington, TX (US); Anahita Banaei, Plano, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 751 days.

(21) Appl. No.: 12/876,976

(22) Filed: Sep. 7, 2010

(65) Prior Publication Data

US 2011/0060538 A1 Mar. 10, 2011

Related U.S. Application Data

(60) Provisional application No. 61/239,986, filed on Sep. 4, 2009.

(51) Int. Cl.
*G01R 31/36* (2006.01)
*G01R 31/02* (2006.01)

(52) U.S. Cl.
CPC .......... *G01R 31/3679* (2013.01); *G01R 31/025* (2013.01); *G01R 31/3651* (2013.01)

(58) Field of Classification Search
CPC .. G01R 31/36; G01R 31/025; G01R 31/3651; G01R 31/3679
USPC ..................................................... 702/63–66
See application file for complete search history.

(56) References Cited

U.S. PATENT DOCUMENTS

| | | | | |
|---|---|---|---|---|
| 4,241,443 A * | 12/1980 | Sakaki et al. | ................. | 370/210 |
| 4,543,660 A * | 9/1985 | Maeda | .......................... | 382/218 |
| 6,515,454 B2 * | 2/2003 | Schoch | ......................... | 320/132 |
| 7,109,685 B2 * | 9/2006 | Tate et al. | ..................... | 320/132 |
| 7,383,142 B2 * | 6/2008 | Scoullar et al. | ................. | 702/66 |
| 7,512,199 B2 * | 3/2009 | Molev-Shteiman et al. | . | 375/350 |
| 8,111,037 B2 * | 2/2012 | Zhang et al. | .................. | 320/104 |
| 8,159,189 B2 * | 4/2012 | Zhang | ........................... | 320/136 |
| 8,165,835 B1 * | 4/2012 | Singh et al. | ..................... | 702/64 |
| 8,213,492 B2 * | 7/2012 | Molev-Shteiman et al. | . | 375/227 |
| 8,265,742 B2 * | 9/2012 | Nikitin et al. | ................. | 600/544 |
| 2005/0057255 A1 * | 3/2005 | Tate et al. | ..................... | 324/426 |
| 2006/0203771 A1 * | 9/2006 | Molev-Shteiman et al. | . | 370/329 |

(Continued)

OTHER PUBLICATIONS

Sabatier, et al., "Fractional system identification for lead acid battery state of charge estimation", Signal Processing 86 (2006) 2645-2657.*

*Primary Examiner* — Gregory J Toatley
*Assistant Examiner* — Ruihua Zhang
(74) *Attorney, Agent, or Firm* — Chowdhury Law Group, P.C.

(57) ABSTRACT

Estimation of a state-of-health (SOH) in a battery are disclosed. An example technique includes determining if a terminal voltage of the chemical battery differs from a calculated terminal voltage. In response to determining that the terminal voltage of the chemical battery differs from the calculated terminal voltage, calculating a range of voltages by taking the convolution of a terminal current of the chemical battery with a range of impulse responses from a look up table of impulse responses corresponding to different SOH. The technique further includes comparing the terminal voltage of the chemical battery with the range of calculated voltages to determine a second impulse response that corresponds to the case where the terminal voltage matches the calculated voltage. The look up table of impulse responses corresponding to different SOHs is then used to determine the SOH of the chemical battery from the second impulse response.

4 Claims, 21 Drawing Sheets

(56) References Cited

U.S. PATENT DOCUMENTS

| | | | |
|---|---|---|---|
| 2009/0048795 A1* | 2/2009 | Scoullar et al. | 702/66 |
| 2009/0146664 A1* | 6/2009 | Zhang | 324/433 |
| 2009/0222226 A1* | 9/2009 | Baraniuk et al. | 702/66 |
| 2010/0121587 A1* | 5/2010 | Vian et al. | 702/63 |
| 2010/0250162 A1* | 9/2010 | White et al. | 702/63 |
| 2010/0258369 A1* | 10/2010 | Ranier et al. | 180/65.29 |
| 2011/0060538 A1* | 3/2011 | Fahimi et al. | 702/63 |
| 2011/0196633 A1* | 8/2011 | Abe et al. | 702/63 |

\* cited by examiner

ESTIMATION OF STATE-OF-HEALTH IN BATTERIES

CROSS REFERENCE TO RELATED APPLICATIONS

This application claims the benefit of the filing date of U.S. provisional patent application No. 61/239,986, incorporated herein by reference, which was filed on Sep. 4, 2009, by the same inventors of this application.

FIELD OF THE INVENTION

The present invention generally relates to real time condition monitoring of chemical batteries. More particularly, the invention relates to online estimation of State-Of-Health in chemical batteries using a battery impulse response.

BACKGROUND OF THE INVENTION

The embodiment described herein relates generally to real time condition monitoring of Li-Ion batteries. The battery impulse response is utilized to estimate the State-Of-Health (SOH) of a Li-Ion battery and to distinguish among possible faults which may occur inside the battery.

Several conventional methods and systems exist for estimating SOH and the parameters effecting the health status of Li-Ion batteries, but they all have some drawbacks. A common battery monitoring method is the full or partial discharge test where the battery is discharged by subjecting the battery to a constant current load. During the discharge, the voltage of the battery is measured and the time it takes to drop to a certain voltage is compared with that of a healthy battery as a means for estimating the health of the battery under test. Besides being expensive and time consuming, the full or partial discharge test damages the battery since routine and deep battery discharge can reduce the life of the battery. Additionally, the test has to be done while the battery is off-line and its accuracy depends on the depth of the discharge.

Another method for estimating the SOH of lead acid batteries uses the coup de fouet phenomenon. In this method, the magnitude of the voltage drop during the early minutes of battery discharge correlates with the SOH of the battery. As the battery ages, the battery encounters a loss of active material utilization caused by various processes such as sulfation and changes in pore structure. These changes result in a decrease of the available battery capacity and thus as the battery ages, the coup de fouet voltage is lowered. Although this method is a quick and simple technique for estimating SOH of the battery, it cannot be done online and additionally requires a constant load for performing the discharge test.

Yet another conventional method for estimating the SOH of batteries involves ohmic techniques including impedance, resistance, and conductance measurements. Measuring the internal resistance of the battery is very sensitive to measurement error and the accuracy of the measurement highly depends of the way the contact is made between the battery terminals and the lead of the ohmic meter. Additionally, none of the ohmic technique methods are efficient for real time estimation of SOH while the battery is under load and the required measurements are not always available in general applications.

The embodiment or embodiments described herein may solve these shortcomings as well as others by proposing a novel method of online SOH estimation of chemical batteries, such as Li-Ion, Ni-MH, Ni—Cd, and Lead-acid, using the concept of battery impulse response.

SUMMARY

In one respect, disclosed is an apparatus for estimating a state-of-health in an online chemical battery, the apparatus comprising: one or more processors and one or more memory units coupled to the processors. The apparatus being configured to: measure a terminal current of the chemical battery, measure a terminal voltage of the chemical battery, measure a temperature of the chemical battery, estimate a state-of-charge of the chemical battery from the terminal current of the chemical battery, the terminal voltage of the chemical battery, and the temperature of the chemical battery, determine a first impulse response of the chemical battery corresponding to the estimated state-of-charge of the chemical battery, wherein the determination is made from a look up table of impulse responses corresponding to different states-of-charge and temperatures, calculate a terminal voltage of the chemical battery by taking the convolution of the measured terminal current with the first impulse response, determine if the measured terminal voltage of the chemical battery differs from the calculated terminal voltage, in response to determining that the measured terminal voltage of the chemical battery differs from the calculated terminal voltage, calculate a range of voltages at the temperature of the chemical battery by taking the convolution of the terminal current of the chemical battery with a range of impulse responses at the temperature of the chemical battery from a look up table of impulse responses corresponding to different states-of-health and temperatures, compare the measured terminal voltage of the chemical battery with the range of calculated voltages to determine a second impulse response that corresponds to the case where the measured terminal voltage matches the calculated voltage, and use the look up table of impulse responses corresponding to different states-of-health and temperatures to determine the state-of-health of the chemical battery from the second impulse response.

In another respect, disclosed is a method for online estimation of a state-of-health in a chemical battery, the method comprising: measuring a terminal current of the chemical battery, measuring a terminal voltage of the chemical battery, measuring a temperature of the chemical battery, estimating a state-of-charge of the chemical battery from the terminal current of the chemical battery, the terminal voltage of the chemical battery, and the temperature of the chemical battery, determining a first impulse response of the chemical battery corresponding to the estimated state-of-charge of the chemical battery, wherein the determination is made from a look up table of impulse responses corresponding to different states-of-charge and temperatures, calculating a terminal voltage of the chemical battery by taking the convolution of the measured terminal current with the first impulse response, determining if the measured terminal voltage of the chemical battery differs from the calculated terminal voltage, in response to determining that the measured terminal voltage of the chemical battery differs from the calculated terminal voltage, calculating a range of voltages at the temperature of the chemical battery by taking the convolution of the terminal current of the chemical battery with a range of impulse responses at the temperature of the chemical battery from a look up table of impulse responses corresponding to different states-of-health and temperatures, comparing the measured terminal voltage of the chemical battery with the range of calculated voltages to determine a second impulse response that corresponds to the case where the measured terminal voltage matches the calculated voltage, and using the look up table of impulse responses corresponding to different states-of-health and temperatures to determine the state-of-health of the chemical battery from the second impulse response.

Numerous additional embodiments are also possible.

BRIEF DESCRIPTION OF THE DRAWINGS

Features and advantages of the present invention will become apparent from the appended claims, the following detailed description of one or more example embodiments, and the corresponding figures.

DETAILED DESCRIPTION OF ONE OR MORE EMBODIMENTS

Figure 1:
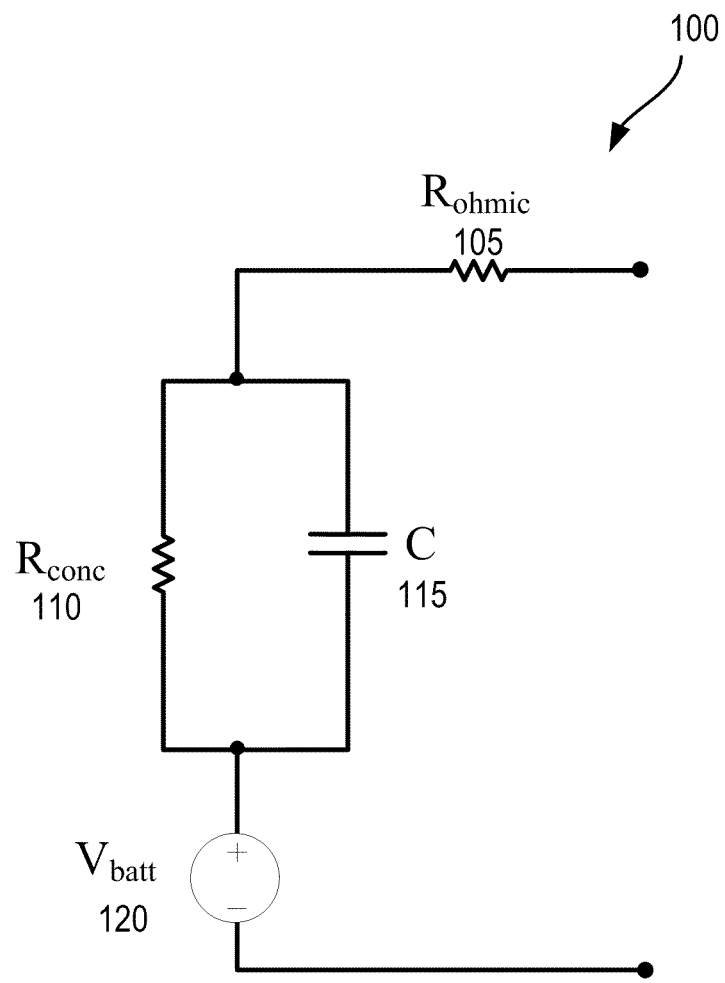
FIG. 1 is a schematic illustration of the equivalent circuit of a rechargeable battery, in accordance with some embodiments.

The drawing figures are not necessarily to scale and certain features may be shown exaggerated in scale or in somewhat generalized or schematic form in the interest of clarity and conciseness. In the description which follows like parts may be marked throughout the specification and drawing with the same reference numerals. The foregoing description of the figures is provided for a more complete understanding of the drawings. It should be understood, however, that the embodiments are not limited to the precise arrangements and configurations shown. Although the design and use of various embodiments are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention. It would be impossible or impractical to include all of the possible embodiments and contexts of the invention in this disclosure. Upon reading this disclosure, many alternative embodiments of the present invention will be apparent to persons of ordinary skill in the art.

Electric and Hybrid Electric Vehicles (EV/HEV) are getting significant attention lately due to the increasing price of gas and concerns about pollution and global warming. Having a reliable, durable, and efficient energy storage system is a necessity for these technologies to be successful. Li-Ion batteries are suitable energy storage system for EV/HEV applications due to their relatively high level of energy and power density, low self-discharge, fast charging, and durability.

One of the important issues in automotive batteries is to monitor their online state-of-charge (SOC) and state-of-health (SOH) due to problems caused by poor battery maintenance. The SOC of the battery is indicative of the amount of charge remaining inside the battery. An accurate and reliable estimation of the SOC is very important in effective management of the energy within the battery. An accurate assessment of the SOC is very important in the charging process as well. An inaccurate estimation of the SOC when the battery is fully charged may lead to the overcharging of the battery and thus a reduction of the lifetime of the battery. Additionally, if the battery is not charged completely, it needs to be charged more frequently which also results in a reduction of the lifetime of the battery. The SOH of the battery is the ability of the battery to store and retain energy. During a battery's lifetime, its performance or health deteriorates gradually due to irreversible physical and chemical changes which are caused by battery usage. Deep discharging, overcharging, and usage in high temperature environments are examples of battery misuse which detrimentally affect the health of the battery. Some of the chemical and physical changes that occur inside a faulty battery are: accumulation of a film of electrolyte decomposition products on the surface of the cathode which result in particle isolation and an increase in the internal impedance of the battery, and chemical reactions in the cathode (cathode decomposition) which isolate active materials in the cathode and form passive surface films on both electrodes. As a result of all these changes, the amount of available active materials or in turn the capacity of the battery is reduced. So, even if the battery is fully charged, the battery cannot deliver its maximum capacity.

Accurate battery models are needed for control strategy development and behavior investigation. Having the precise battery model, the effect of various conditions may be observed without causing any problems to the battery. Various methods have been developed for modeling a battery. Some of them are based on the electrochemical characteristics and the dynamics of the battery. A dynamic model which is able to capture the electrochemical reaction dynamics of the battery is basically in high order and too complex for a practical use. Although, such models may be used as a baseline in order to obtain more manageable reduced order models.

While physics-based models have been built to study the internal dynamics of Li-Ion batteries, these models are not suitable for the system level. For this reason, another method based on electrical properties of the battery has emerged which is called the equivalent circuit model. It provides a model to explain the voltage waveforms and to quantify the results into four circuit parameters which represent various parts of the battery. Various equivalent circuit models have been developed. FIG. 1 shows a typical equivalent circuit of a rechargeable battery 100. $R_{ohmic}$ 105 represents the electrode and packaging resistance of the battery, $R_{conc}$ 110 represents the battery's internal resistance, which defines the maximum current a battery can deliver and accounts for charging and discharging losses, C 115 represents the capacity of the battery which is formed by series connection of the double layer capacitance formed by each pair of battery cells and is indicative of the finite amount of electric charge stored inside the battery, and $V_{batt}$ 120 represents the battery's rated voltage at no-load (open circuit) condition. To obtain various parameters of the equivalent circuit model, various charging and discharging tests are made.

Fundamentals of the Impulse Response Modeling Method:

Convolution is a formal mathematical operation just like multiplication and addition. Convolution differs in that it takes two signals instead of two numbers and produces a signal. The convolution of two functions such as f and g is denoted by f*g and the basic definition is given by the integral of one function at t multiplied by another function at t−τ (over the entire domain of the independent variable, i.e. time). This operation is shown in equation (1).

$$(f*g)(t) = \int_{-\infty}^{+\infty} f(\tau)\cdot g(t-\tau)d\tau = \int_{-\infty}^{+\infty} f(t-\tau)\cdot g(\tau)d\tau \quad (1)$$

The convolution in discrete domain is represented as expressed in equation (2).

$$(\hat{f}*\hat{g})[n] = \sum_{k=-\infty}^{+\infty} \hat{f}[k]\cdot\hat{g}[n-k] = \sum_{k=-\infty}^{+\infty} \hat{f}[n-k]\cdot\hat{g}[k] \quad (2)$$

Convolution has some specific mathematical properties such as commutative, associative, and distributive. The commutative property, as expressed in equation (3a), states that it does not matter which function is taken first and the order in which signals are convolved can be exchanged, the associative property of convolution, as expressed in equation (3b), describes how three signals can be convolved, and the distributive property, as expressed in equation (3c), indicates that parallel systems with added outputs can be replaced with a single system.

$$a[n]*b[n]=b[n]*a[n] \quad (3a)$$

$$(a[n]*b[n])*c[n]=a[n]*(b[n]*c[n]) \quad (3b)$$

$$a[n]*b[n]+a[n]*c[n]=a[n]*(b[n]+c[n]) \quad (3c)$$

From the linear system theory, the output of a linear time invariant (LTI) system for an arbitrary input may be determined using its impulse response as shown in equation (4).

$$y[k]=x[k]*h[k] \quad (4)$$

where x[k], h[k], and y[k] depict the input, impulse response, and output of the system. In other words, the convolution of the input to the system with its impulse response gives the output of the system. A linear system's characteristics are completely specified by its impulse response, which is implemented by the mathematics of convolution. If two systems are different in any way, they will have different impulse responses.

ARMAX Modeling Method:

For a single-input/single-output system (SISO), the autoregressive moving average model (ARMAX) polynomial model structure is given by equation (5), $$A(q)y(t)=B(q)u(t)+C(q)e(t) \quad (5)$$

where y(t) represents the output at time t, u(t) represents the input at time t, e(t) is the white-noise disturbance, and $q^{-1}$ is the back-shift operator. The coefficients are defined as expressed in equations (6a), (6b), and (6c), $$A(q)=1+a_1q^{-1}+\ldots+a_nq^{-n} \quad (6a)$$

$$B(q)=b_1+b_2q^{-1}+\ldots+b_mq^{-m} \quad (6b)$$

$$C(q)=1+c_1q^{-1}+\ldots+a_rq^{-r} \quad (6c)$$

where n, m, and r are the orders of the polynomials, respectively. The appropriate model orders should be determined in order to estimate the ARMAX model. Having the specified model, the input current of the battery may be used as the input of the model (u(t)) and by using the polynomials, the output voltage can be calculated (y(t)). ARMAX models may be used to express the impulse response of a discrete time LTI system numerically.

Figure 2A:
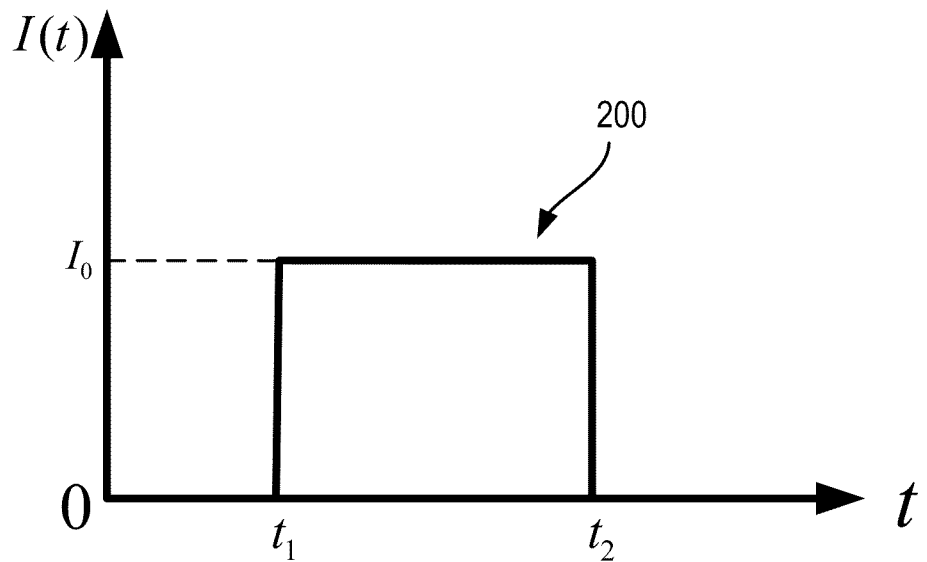
FIG. 2(a) is a graph of the applied pulse of current, in accordance with some embodiments.
Figure 2B:
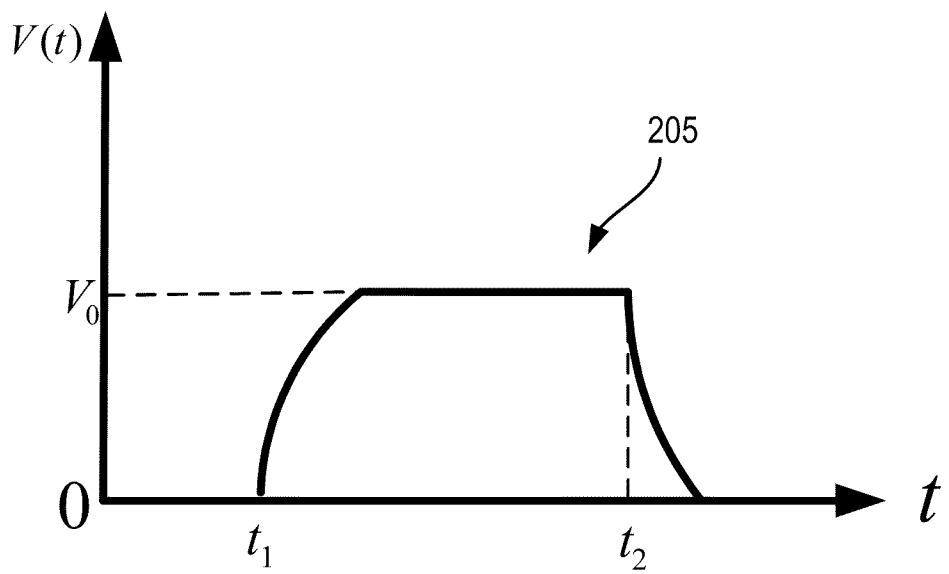
FIG. 2(b) is a graph of the output voltage of the battery resulting from the applied pulse of current, in accordance with some embodiments.

Calculation of the Impulse Response:

The impulse response of a battery may be used as a battery model and substituted with the battery to calculate the output voltage. In order to determine the impulse response of a battery, a narrow pulse of current (with a unitary area) 200 is applied to the battery and the output voltage 205 is monitored as shown in FIGS. 2(a) and 2(b), respectively. Having the impulse response of the battery and convolving it with any arbitrary input current, the output voltage can be calculated. The output voltage can be shown as expressed in equation (7).

$$v[k]=i[k]*h[k] \quad (7)$$

where i[k], h[k], and v[k] are the battery terminal current, the impulse response of the battery, and the terminal voltage, respectively. In order to define an impulse for a specific system, a first order LTI system is characterized as expressed in equation (8), $$\frac{dy}{dt} + \frac{1}{\tau}y = x(t) \tag{8}$$

where y is the output, x is the input, and τ is the time constant of the system. Taking the Laplace transform, the transfer function of the system would be presented as expressed in equation (9).

$$H(s) = \frac{\tau}{1+\tau \cdot s} \tag{9}$$

Figure 3:
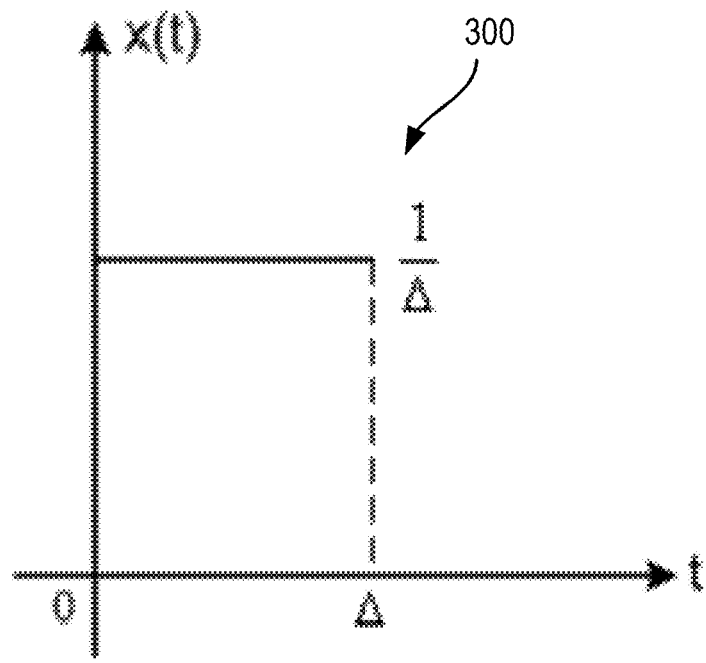
FIG. 3 is of a typical input for the system, in accordance with some embodiments.

Supposing that the input of the system (f(t)) 300 is defined as shown in FIG. 3 which is characterized as equation (10), $$f(t) = \frac{1}{\Delta}(u(t) - u(t-\Delta)), \tag{10}$$

the Laplace transform of f(t) is calculated as shown in equation (11).

$$\begin{aligned} F(s) &= \frac{1}{\Delta \cdot s}(1 - e^{-\Delta s}) \tag{11} \\ &= \frac{1}{\Delta \cdot s}\left[1 - \left(1 + (-\Delta \cdot s) + \frac{(-\Delta \cdot s)^2}{2!} + \frac{(-\Delta \cdot s)^3}{3!} + \ldots\right)\right] \\ &= 1 - \frac{\Delta \cdot s}{2!} + \frac{(\Delta \cdot s)^2}{3!} - \frac{(\Delta \cdot s)^3}{4!} + \ldots \end{aligned}$$

In order to find the response of the system to the input f(t), F(s) is multiplied by the transfer function of the system, H(s), as expressed in equation (12).

$$\begin{aligned} Y(s) = F(s).H(s) &= \frac{\tau}{1+\tau \cdot s} \times \left[1 - \frac{\Delta \cdot s}{2!} + \frac{(\Delta \cdot s)^2}{3!} - \frac{(\Delta \cdot s)^3}{4!} + \ldots\right] = \Bigg[ \tag{12} \\ &\frac{\tau}{1+\tau \cdot s} - \frac{\tau}{2!} \times \left(\frac{\Delta \cdot s}{1+\tau \cdot s}\right) + \\ &\frac{\tau(\Delta \cdot s)}{3!} \times \left(\frac{\Delta \cdot s}{1+\tau \cdot s}\right) - \frac{\tau(\Delta \cdot s)^2}{4!} \times \left(\frac{\Delta \cdot s}{1+\tau \cdot s}\right) + \ldots \Bigg] \end{aligned}$$

In order to consider f(t) as an impulse, the response of the system to f(t) should be equal to the impulse response of the system as shown in equation (13).

$$Y(s) = F(s) \cdot H(s) = H(s) = \frac{\tau}{1+\tau \cdot s} \tag{13}$$

This means that all the terms except the first one in equation (12) need to be zero. Therefore if Δ is much smaller than the time constant of the system, f(t) can be assumed as an impulse for the system.

The next question is how small Δ should be in order to consider f(t) as an impulse for the system. To answer this question, all but the first two terms of the equation (12) are assumed to be zero. It is assumed that the second term may be ignored if it is smaller than ten percent of the total value, which means as shown in equations (14a) to (14e).

$$Y(s) = \tag{14a}$$
$$\frac{\tau}{1+\tau \cdot s} - \frac{\tau}{2!} \times \left(\frac{\Delta \cdot s}{1+\tau \cdot s}\right) \xrightarrow{L^{-1}} y(t) = \tau \cdot e^{-\tau \cdot t} - \frac{\tau \cdot \Delta}{2!}(-\tau \cdot e^{-\tau \cdot t})$$

$$\tau \cdot e^{-\tau \cdot t} < 10\% \times \left(\tau \cdot e^{\tau \cdot t} - \frac{\tau \cdot \Delta}{2!}(-\tau \cdot e^{-\tau \cdot t})\right) \tag{14b}$$

$$1 < 0.1 \times \left(1 + \frac{\tau \cdot \Delta}{2}\right) \tag{14c}$$

$$20 < 2 + \tau \cdot \Delta \tag{14d}$$

$$18 < \tau \cdot \Delta \tag{14e}$$

Therefore, in order to ignore the second term of the equation (12), not only should Δ be much smaller that the time constant (Δ<<τ), but also the equation (14e) should be considered. The same method can be generalized to other terms of the equation (12). It must be noted that the impulse response of a battery is related to various parameters such as state-of-charge, state-of-health, temperature, and the magnitude of the current applied to the battery to calculate the impulse response. Different battery states result in various impulse responses corresponding to that specific situation.

Figure 4A:
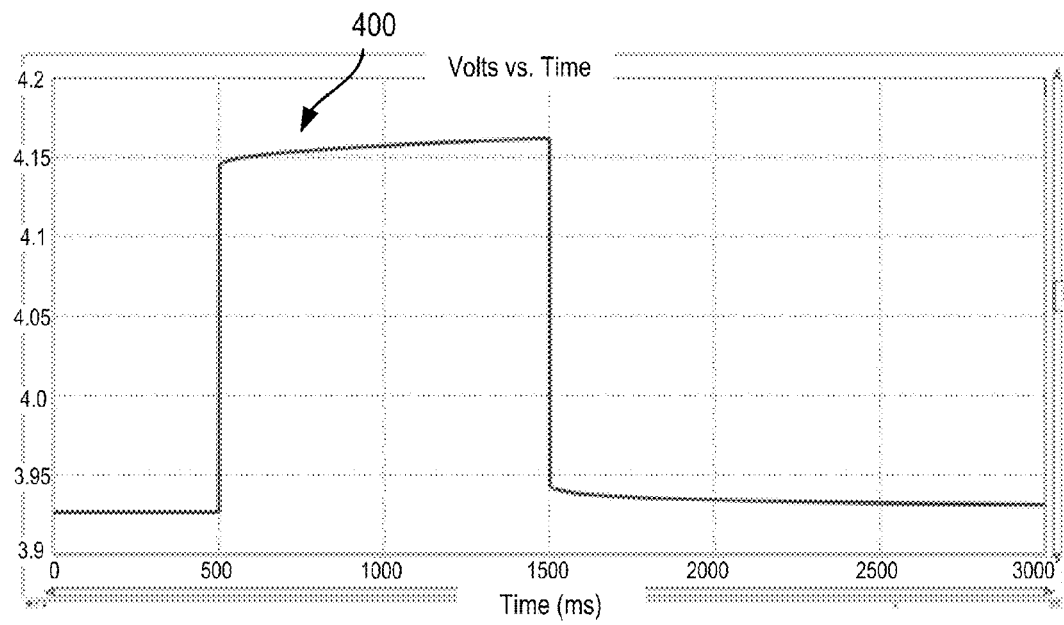
FIG. 4(a) is a graph of the impulse response of a Li-Ion battery with a state-of-charge of 80%, in accordance with some embodiments.
Figure 4B:
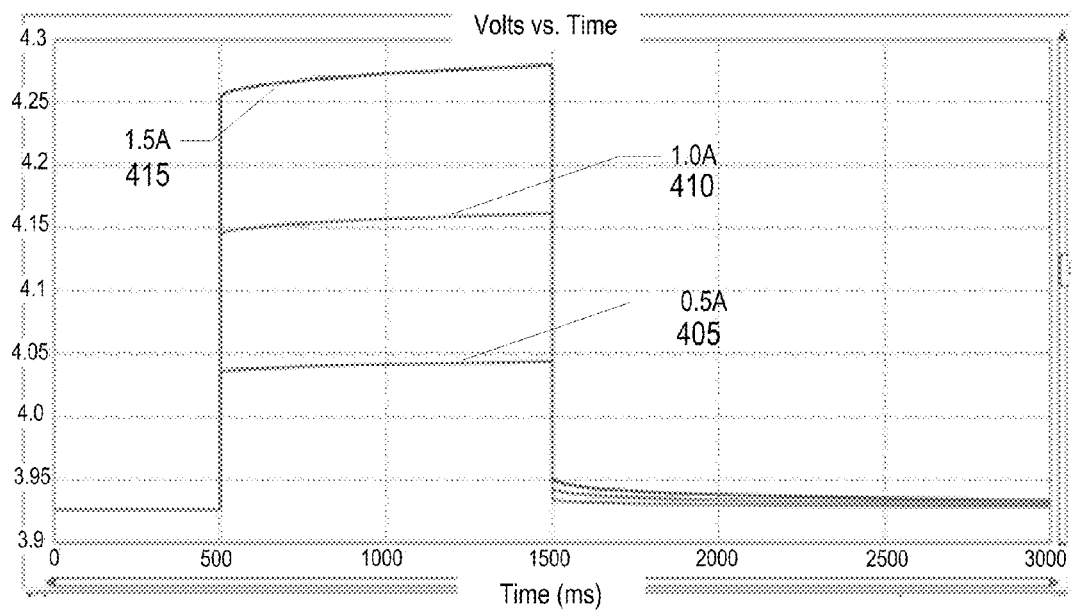
FIG. 4(b) is a graph of the voltage responses of a Li-Ion battery with state-of-charge of 80% to current magnitudes of 0.5 A, 1 A, and 1.5 A, in accordance with some embodiments.

Simulation and Experimental Results:

As mentioned earlier, the impulse response of a battery may be used as a model to investigate the electrical and dynamic behavior of the battery. To validate this invention, two different types of Li-Ion batteries, 18650 and 26650 have been used for experimental tests. The capacity of the 18650 battery is 2.2 Ah and the capacity of the 26650 battery is 3.0 Ah. The experiments were done at room temperature, 25° C. The idea has been verified by simulation results using Battery Design Studio software V13.6 and the model of the 18650 Li-Ion battery. FIG. 4(*a*) shows the impulse response 400 of the 18650 Li-Ion battery model to a one second charging pulse for a state-of-charge of 80% and FIG. 4(*b*) shows voltage responses of the same battery model to one second charging pulses for current magnitudes of 0.5 A 405, 1 A 410, and 1.5 A 415 for a state-of-charge of 80%.

To identify the impulse response of the battery, a specific discharging pulse is applied to the battery with a known state-of-charge. The measured voltage waveform along with the applied current is used by the System Identification Toolbox from MATLAB® to calculate the impulse response. Using this toolbox, the impulse response is identified and stored in the form of an ARMAX model. The identified impulse response may be used as the battery model to calculate the output voltage of the battery.

Fault Classification:

Li-Ion batteries have specific characteristics such as high power and energy density in comparison to other conventional batteries which make them possible to be reduced in size and weight. These reductions improve their use in Electric and Hybrid Electric Vehicles (EV/HEV). However, lifetime performance remains an issue for Li-Ion batteries. Identifying the causes of battery degradation and investigating the impact of different accelerating factors on the specific degradation and as a result on the lifetime of the battery have been an ongoing challenge. There are various parameters contributing to the battery aging process in Li-Ion batteries and they can be modeled in different ways. The most common parameters are addressed here.

a) Electrolyte Decomposition:

The electrolyte of Li-Ion batteries consists of lithium salts dissolved in a solvent such as $LiPF_6$, $LiBF_6$, or $LiClO_4$ to act as a carrier, conducting lithium ions between the anode and the cathode. Considering $LiPF_6$ as active material of the electrolyte, the reaction expressed in equation (15) takes place.

$$LiPF_6 \Leftrightarrow LiF + PF_5 \qquad (15)$$

$PF_5$ reacts readily with the solvents to form decomposition products on the surface of the electrode even at a relatively low temperature (45° C.). The accumulation of the electrolyte decomposition products on the surface of the cathode particles causes active material isolation and an increase in the impedance at the cathode/electrolyte interface, resulting in the loss of capacity and power capability. Operating temperature of the battery has a significant impact over the film growth. The cycle life of a battery decreases as temperature increases. In order to model the electrolyte decomposition by software, the electrolyte density of the battery can be decreased. Another method for modeling this fault is to reduce the available active area over positive electrode by minimizing the cathode width.

b) Formation of Surface Films on Positive Electrode:

The positive electrode is generally composed of a lithium metal oxide such as $LiCoO_2$, $LiNiO_2$, and $LiMn_2O_2$. The negative electrode is a carbon-based material which is normally made of graphite. The decomposition of the $LiCoO_2$ as the active material of positive electrode may be presented as expressed in equation (16), $$LiCoO_2 \rightarrow (1-x)[Co_3O_4 + O_2\uparrow]/3 + xLiCoO_2, \qquad (16)$$

where the active material decomposes into inactive $Co_3O_4$, which will be formed at the surface of the cathode. This phenomenon reduces the amount of active material available in the positive electrode. It means that the amount of electrochemically active $Li^+$ ions that can interact in the cathode or on the other hand the maximum capacity of the positive electrode ($Q_{max}^+$) will decrease. As a result, the EMF model parameters of the battery will also change. In order to compare both models, the parameters related to the healthy battery are also represented here. Because of the $Co_3O_4$ layer formation over the positive electrode surface, an amount of active $Li^+$ ions remains stored inside the electrode. This is the reason that the overall amount of $Li^+$ ions inside the aged battery $Q_{a\ max}$ is higher than the maximum capacity of the positive electrode $Q_{a\ max}^+$, whereas in a healthy battery, $Q_{max}^+$ is higher than $Q_{max}$. By aging the battery, the amount of $Li^+$ ions which remains inside the negative electrode at the end of discharge ($Q_{a0}^-$ comparing to $Q_0^-$) will also increase. Formation of particles at the electrode surface also causes an increase of the battery impedance. A battery with low cathode capacity might still be able to deliver an acceptable charge for low discharge C-rate currents, but it cannot perform properly at higher C-rate currents. Software modeling of the positive electrode decomposition may be done by reducing the active material density in the cathode. In this way, the total amount of $Li^+$ ions available decreases and the overall storage capacity of the battery will decrease.

c) Internal Short Circuit (Soft Short):

A Li-Ion battery is made of a coated anode and cathode separated by thin layers of polymer material called a separator. The width of the separator is normally less than 25 μm. The thinner the separator layer is made, the more energy density in a smaller volume of battery is achieved. If the battery is used in high temperature, the separator may melt in some points and puncture. It also may happen if some manufacturing faults occur during creating individual cells or when the battery is under pressure in specific situations. By puncturing the separator, the anode and the cathode of the battery will be shorted and a current path is created between the two electrodes which causes the battery to discharge internally.

The self-discharge of the battery because of internal short circuit, which is called "soft short," is one of the factors causing battery temperature to rise and disables the battery's ability to hold its charge naturally. This soft short deteriorates the health status of the battery. In the worst case, it could lead to thermal runaway and may cause an ignition or explosion of the cell. Accidents involving Li-Ion batteries have occurred frequently. There have been numerous instances of the Li-Ion batteries used in laptop computers or cellular phones overheating or catching fire. The cause of these faults is assumed to be an internal short circuit which is one of the factors increasing the battery temperature. For the case of external short circuit, $W_i$ generated by short circuit current I in internal resistance $R_i$ is calculated as shown in equations (17a), (17b), and (17c).

$$W_i = \int_{-\infty}^{+\infty} I^2 R_i \cdot dt \qquad (17a)$$

$$I = E/(R_i + R_s) \qquad (17b)$$

$$W_i = \int_{-\infty}^{+\infty} E^2 R_i / (R_i + R_s)^2 \cdot dt \qquad (17c)$$

$W_i$ has the highest value when the short-circuit resistance, $R_s$, equals zero and it decreases as $R_s$ increases. External short circuits can be prevented with electric protection circuits.

In the case of internal short circuit, the model is the same as the one for the external short circuit except that both the short circuit resistance $R_s$ and the internal resistance $R_i$ are inside the battery. The heat generated by the short circuit resistance $R_s$ causes local and rapid heating inside the battery. The heat $W_s$ generated by the short circuit current I inside the internal short circuit resistance $R_s$ is calculated as shown in equations (18a), (18b), and (18c).

$$W_s = \int_{-\infty}^{+\infty} I^2 R_s \cdot dt \qquad (18a)$$

$$I = E/(R_i + R_s) \qquad (18b)$$

$$W_s = \int_{-\infty}^{+\infty} E^2 R_s / (R_i + R_s)^2 \cdot dt \qquad (18c)$$

$W_s$ has the highest value when the short circuit resistance $R_s$ is the same value as the internal resistance $R_i$ which is the most dangerous condition. The internal short circuit cannot be protected using an external protection circuit and it is one of the worst scenarios in battery technology for which there is nothing that can be done.

To know the tolerance of the Li-Ion batteries to internal short circuit, several tests need to be done. One popular test is the nail penetration test which simulates the situation of the internal short circuit inside a battery and the response of the cell to such failure is investigated. In this test a narrow iron nail penetrates into the battery and creates a multi-point internal anode to cathode short. Response of the battery is monitored using a high speed camera. There are many parameters to consider in a nail test, such as the nail size and penetration speed and the leakage of accumulated gas and electrolyte from the pierced point. Another method to study the internal short circuit is the crush test. This method simulates a massive internal short circuit of a cell by crushing the cell. Special tools are used for this purpose in order to assure maximum internal damage without cracking the case. The crush test has some advantages comparing to the nail test, for example there is no leakage of the electrolyte because there is no hole over the cell case, and as a result the internal short circuit situation is modeled more precisely.

Figure 5:
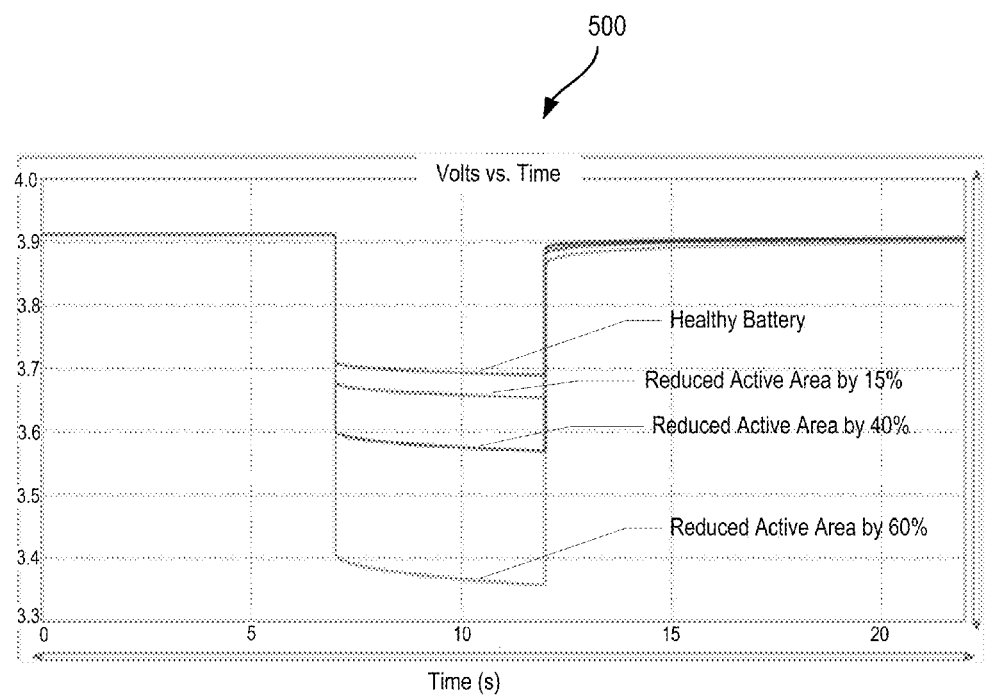
FIG. 5 is a graph of the effect of reducing cathode active area of the voltage response to a discharging current pulse of 1 A, in accordance with some embodiments.
Figure 6:
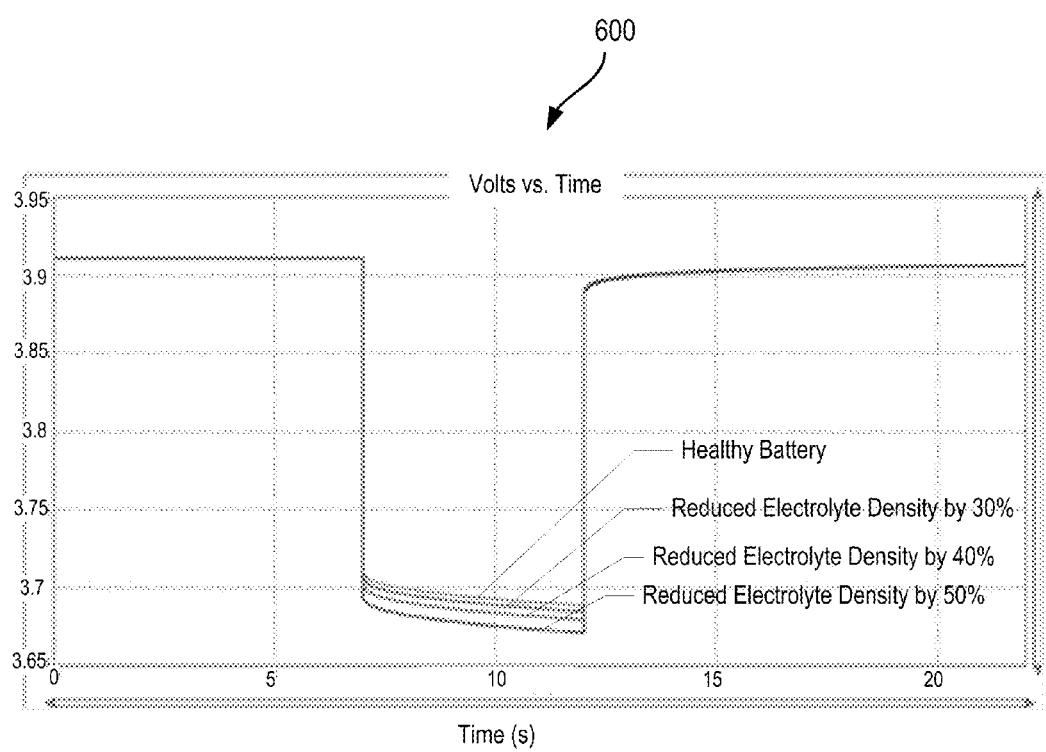
FIG. 6 is a graph of the electrolyte density reduction on the voltage response to a discharging current pulse of 1 A, in accordance with some embodiments.

Fault Simulation and Analysis:

To study the effect of various faults over the battery behavior, different faults have been simulated using Battery Design Studio software V13.6 and the model of 18650 Li-Ion battery with the capacity of 2.2 Ah. This software is designed for data analysis, design, and simulation of the batteries. Various parameters of the battery can be specified by the user and their effect on the battery behavior can be studied. Both electrolyte and electrode decompositions lead to formation of a layer over the positive electrode and reduction of its active area. FIG. 5 shows the effect of reducing cathode active area on the voltage response of the battery 500. A charging current of 1 A is applied to the 18650 Li-Ion battery software model with the SOC of 70%. It is shown in FIG. 5 that the output voltage response varies according to the amount of active area reduction. Another method to model the electrolyte decomposition is to reduce the electrolyte density. FIG. 6 shows the effect of electrolyte decomposition 600 by decreasing the electrolyte density of the battery with rates of 30%, 40%, and 50%. FIG. 6 shows that various results are achieved with different electrolyte densities.

As is shown in FIG. 5 and FIG. 6, the battery sensitivity to the electrolyte decomposition is less than its sensitivity to the positive electrode decomposition. In other words the voltage response of the cell changes dramatically when the active area reduces, but changes in the electrolyte density do not make a significant difference in the output voltage. Small changes in the voltage could be caused by several possible situations. For example, reduced active area by 15% leads almost to the same situation as the reduced electrolyte density by 50%.

Figure 7:
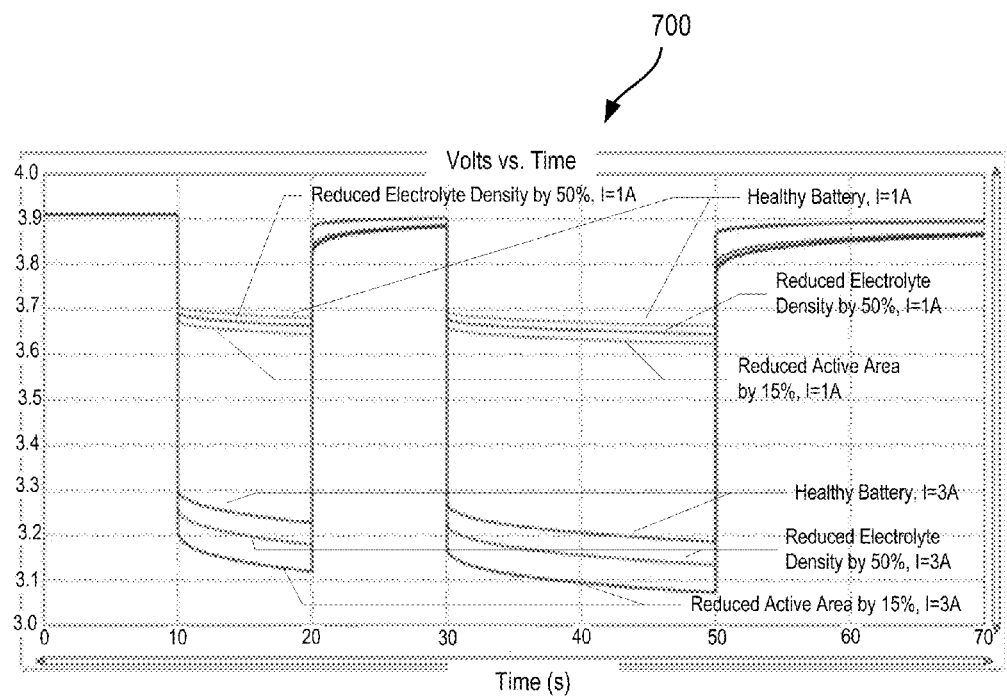
FIG. 7 is a graph of the effect of change in current magnitude on the voltage response for two different fault situations, in accordance with some embodiments.

The mentioned phenomenon may be used as a signature to distinguish between these two types of faults. Because of the higher sensitivity of the battery voltage response to the active area reduction comparing to the electrolyte density decrease, the response of the battery to larger current magnitudes would encounter more changes as well. FIG. 7 compares the two different cases which make close changes in the voltage response of the battery: electrolyte density reduction by 50% and active area reduction of the positive electrode by 15% 700. FIG. 7 shows how increasing the current magnitude applied to the battery will increase the effect of the active area reduction of the positive electrode more than the effect of the electrolyte density reduction.

Figure 8:
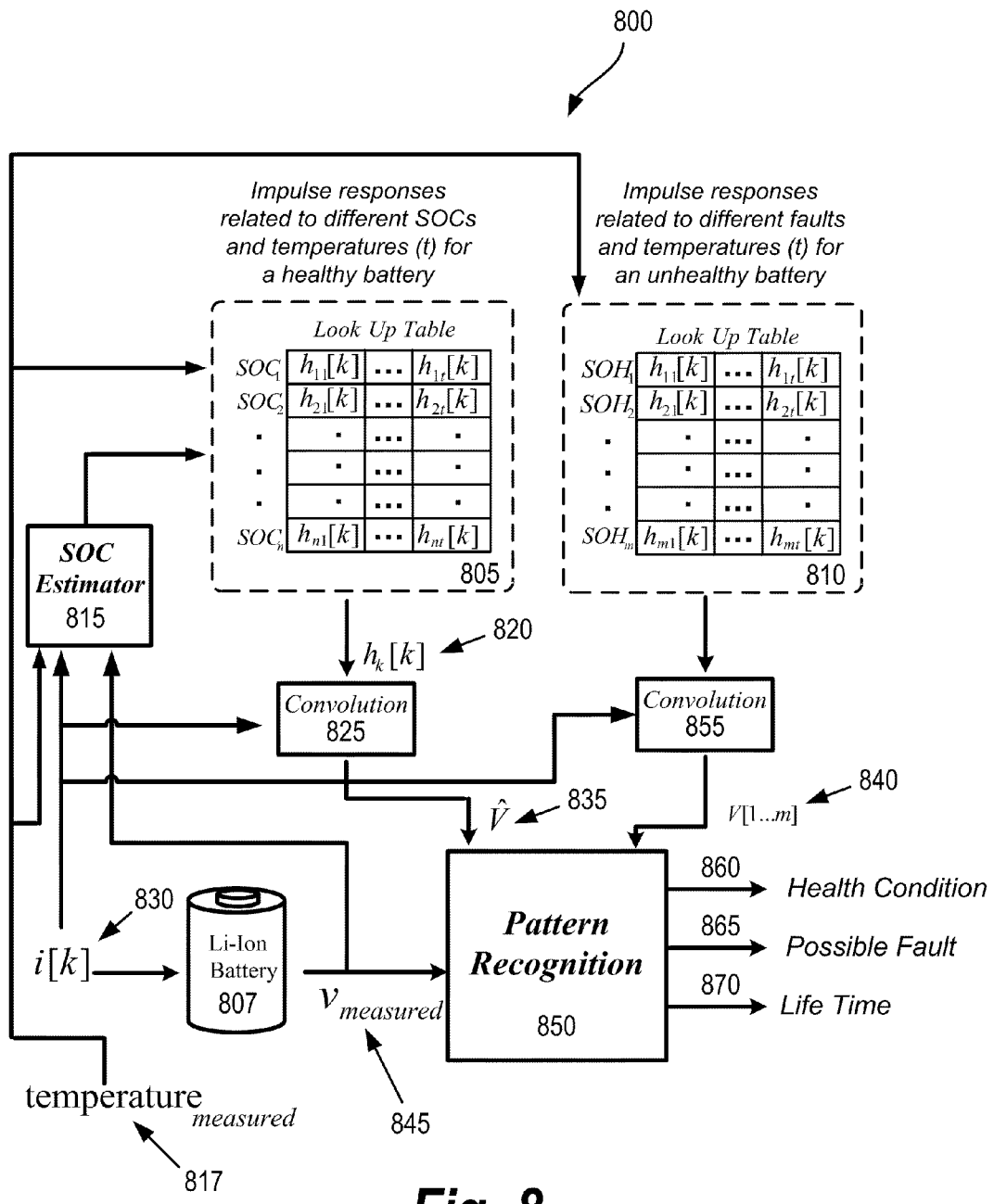
FIG. 8 is a flow diagram illustrating the state-of-health estimation method, in accordance with some embodiments.

State-of-Health Estimation Method:

In this section, the proposed method for estimating the SOH of Li-Ion batteries is explained. For modeling the battery in the proposed method, the impulse response of the battery introduced earlier is applied. The impulse response is dependent upon the amount of charge left in the battery (SOC) and also the health status of the battery (SOH). Different levels of SOC and various faults imply different impulse responses. It must be noted that the term impulse inherently suggests that the duration of the current pulse is significantly smaller than the smallest time constant in the system.

a) Method Description:

FIG. 8 shows the block diagram of the SOH estimation algorithm 800. A family of impulse responses for various levels of SOC and temperature for a healthy battery are recorded and used such that the whole available range of the SOC and the temperatures of the battery is being presented by "nt" individual values corresponding to a specific impulse response ($h_{nt}[k]$). The impulse responses corresponding to different SOCs at a certain temperature are formatted into an ARMAX model and the corresponding coefficients are stored in a look up table 805. Multiple sets of corresponding coefficient are stored in the look up table in order to cover the operating temperature range of the battery 807. For example, in one embodiment, the temperature may range from −40° C. to 120° C. by intervals of 10° C. and the SOC may range from 0% to 100% by intervals of 5%. Thus, the look up table for the impulse responses related to SOC 805 and the look up table for the impulse responses related to the different faults 810 will both be two dimensional array tables dependent on SOC and SOH, respectively, and temperature. As mentioned previously, the multivariable ARMAX model is shown as expressed in equation (18).

$$A_0 \times y(t) + A_1 \times y(t-T) + \ldots + A_n \times y(t-nT) = B_0 \times u(t) + B_1 \times u(t-T) + \ldots + B_m \times u(t-mT) + e(t) \quad (18)$$

The coefficients are determined based on the current and voltage input waveforms used for the impulse response calculation. Using the experimental data, the impulse response of the battery is represented as equation (19).

$$y(t) = B_0 \times u(t) + B_1 \times u(t-T) + \ldots + B_m \times u(t-mT) + e(t) \quad (19)$$

Figure 9:
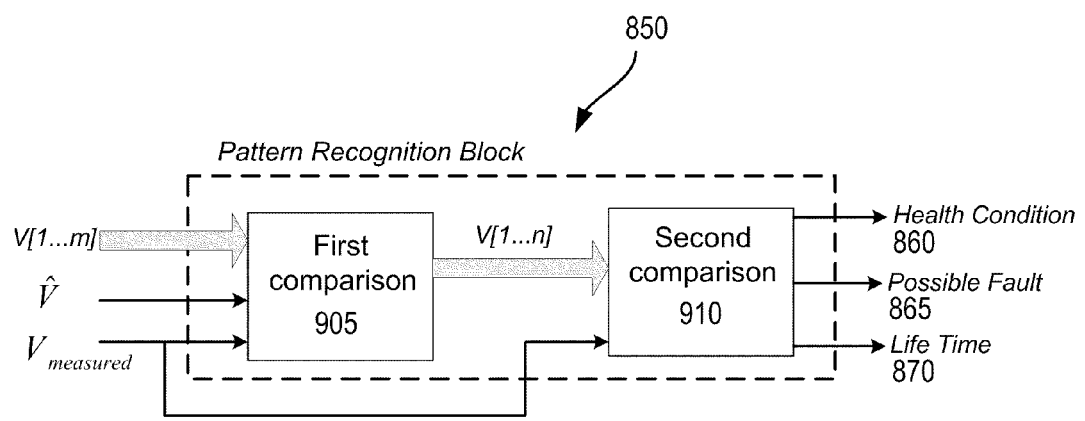
FIG. 9 is a schematic illustration showing the pattern recognition block, in accordance with some embodiments.

Measuring the SOC of the battery using the SOC estimator block 815 and the temperature 817, the impulse response of the battery corresponding to the specific SOC and temperature is selected 820 and used for convolution 825 by the arbitrary input current 830 to calculate the output voltage 835. The impulse responses corresponding to different fault situations are also stored in a look up table 810. The applied current to the battery 830 is convolved 855 with all these impulse responses and a set of output voltages are calculated 840. The measured output voltage 845 from terminals of the battery and the calculated output voltage 835 using the specific impulse response corresponding to the battery state-of-charge are compared using the fitness function, explained in the section Comparison Method, to determine the health condition 860, possible fault occurred 865, and the life time 870 of the battery. The pattern recognition block 850 itself contains two different comparison blocks. After the first comparison 905 of the voltage waveforms using the fitness function, another comparison 910 is made for the waveforms with close fitness percentages, but this time by applying a larger current magnitude to the cell. Because of the higher sensitivity of the battery voltage to one type of fault comparing to the other type, the exact type of the fault 865 and the health condition 860 of the cell is determined using this method. The life time 870 of the battery is also estimated by the comparison of the fitness percentage of the healthy battery impulse response with the best fit to the measured voltage. FIG. 9 depicts the details of the pattern recognition block 850.

b) Comparison Method:

In order to compare the calculated voltage waveforms with the measured voltage of the battery in the pattern recognition block, a mathematical method is used. This method calculates the percentage of the output that the impulse response model reproduces, which is called the Fitness percentage (Fit (%)). The Fitness percentage is based on the mean square error between the measured data and the simulated output of the model which is calculated as shown in equations (20a) and (20b), $$E = \frac{1}{n} \sum_{i=1}^{n} \left( \frac{V_i - \hat{V}_i}{V_i} \right)^2 \quad (20a)$$

-continued $$\text{Fit}(\%) = (1 - E) \times 100 \tag{20b}$$

where $V_i$ and $\hat{V}_i$ are the measured and calculated data samples, respectively, and n is the number of samples. 100% corresponds to a perfect fit (no error) and 0% corresponds to a model which is not capable of estimating any variation of the output. By calculating the Fitness value of a battery model, the accuracy of the model in estimating the response of the battery is verified and by comparing the Fitness values of various models, the model with the best fit for the battery is identified.

The amount of the Fitness percentage depends on the specific variables such as state-of-charge, temperature, and the current magnitude. Based on the variations in these variables the amount of the Fitness would change. The sensitivity of the Fitness function is defined as expressed in equation (21).

$$S^{Fit} = \frac{\partial \text{Fit}}{\partial SOC} + \frac{\partial \text{Fit}}{\partial T} + \frac{\partial \text{Fit}}{\partial I} \tag{21}$$

The measured voltage of the battery ($V_i$) used in equation (20a) is related to the open-circuit voltage (EMF) and the current magnitude by the equation (22), $$V_i = EMF - RI(t) \tag{22}$$

where R is the internal resistance of the battery. Having these equations, the dependency of the Fitness function to the SOC, temperature, and current of the battery is verified.

c) Simulation Results:

To verify the proposed method by simulation, six different fault situations are selected. These include: active area reduction of the positive electrode by 15%, active area reduction of the positive electrode by 40%, active area reduction of the positive electrode by 60%, electrolyte density reduction by 30%, electrolyte density reduction by 50%, and electrolyte density reduction by 70%. The impulse responses corresponding to these faults for a specific state-of-charge (SOC=70%) are calculated and stored in the form of an ARMAX model. The System Identification Toolbox from MATLAB® is used to calculate the required impulse responses. The impulse response of the healthy battery for SOC of 70% is also calculated and stored.

A discharging current pulse with the magnitude of 1 A is applied to the 18650 battery model of the Battery Design Studio software. The same current waveform is applied to all impulse responses and the calculated voltages along with the measured voltage are compared using the fitness function explained earlier. If there is one waveform which fits the measured voltage the best and its fitness percentage is significantly higher than the values of other waveforms, then the decision about the health status and the possible fault can be made at this time. But if the fitness percentages for some of the waveforms are close and a certain decision cannot be made, then the second level of comparison is implemented. In this level the current magnitude is increased to 3 A in order to verify the sensitivity of the remained impulse responses and to find the best fit.

Figure 10:
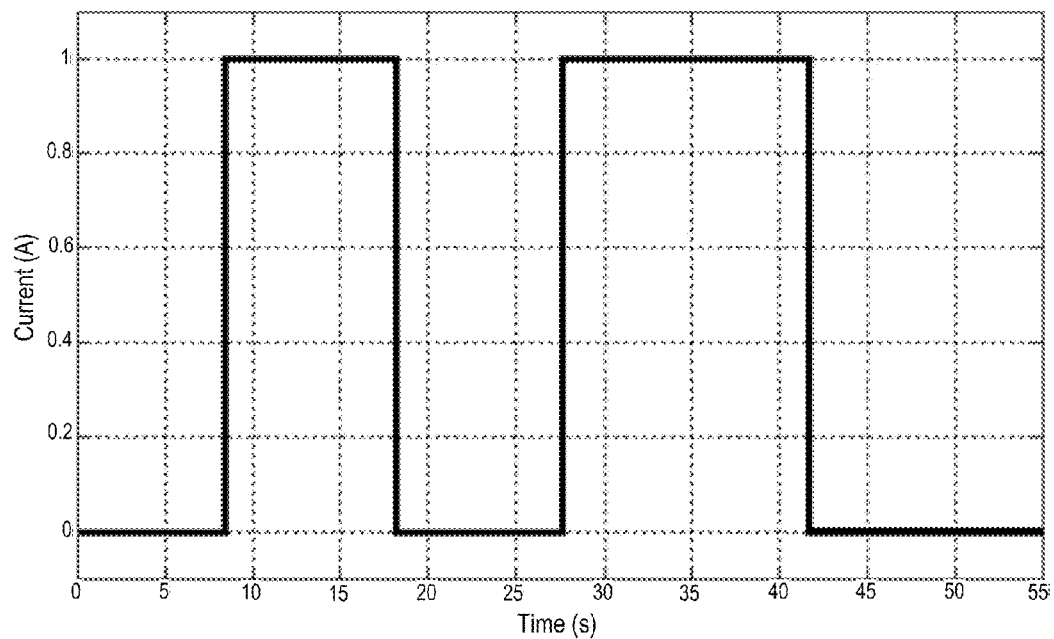
FIG. 10 is a graph showing the applied current waveform, in accordance with some embodiments.
Figure 11:
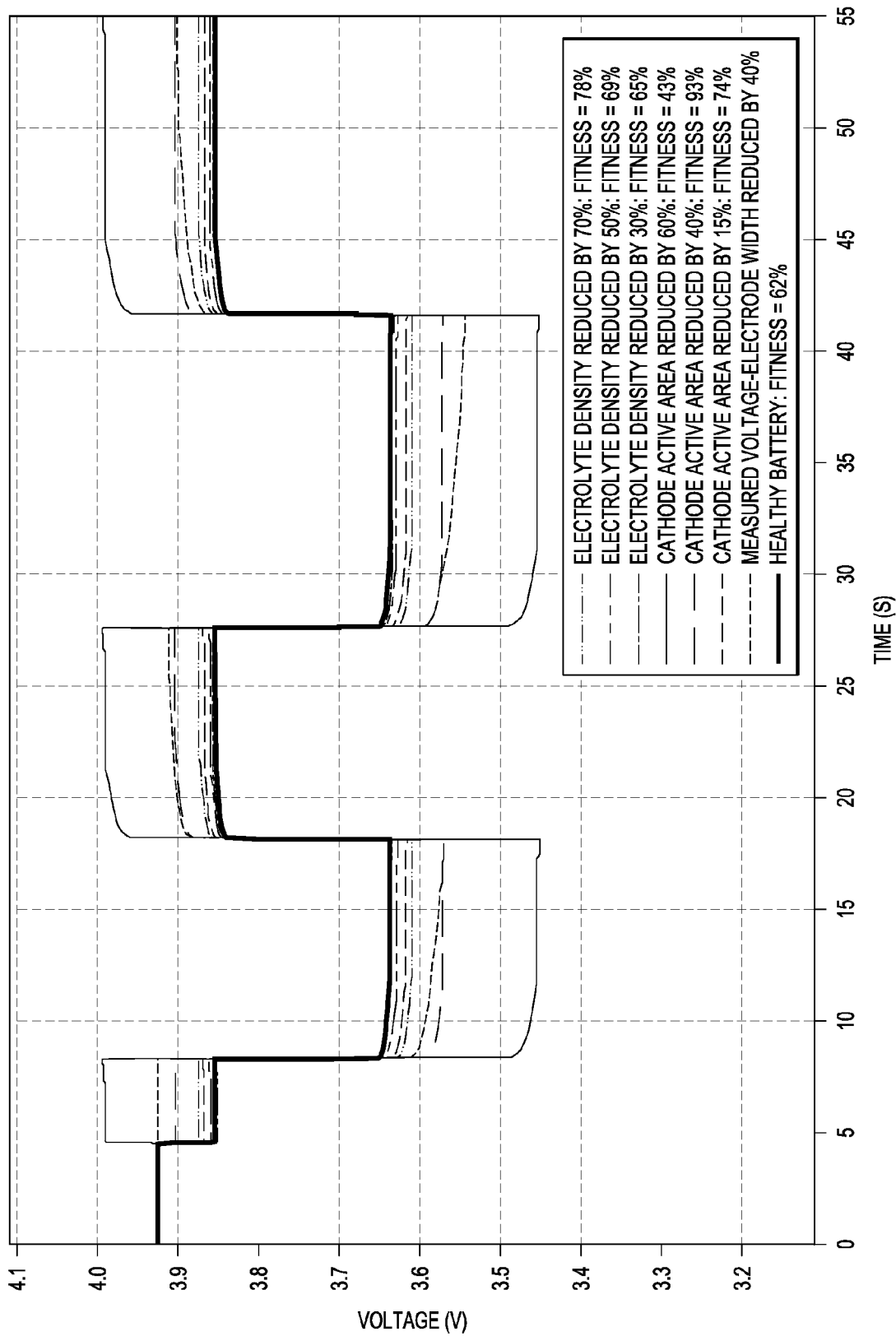
FIG. 11 is a graph comparing the measured and calculated voltages, in accordance with some embodiments.
Figure 12:
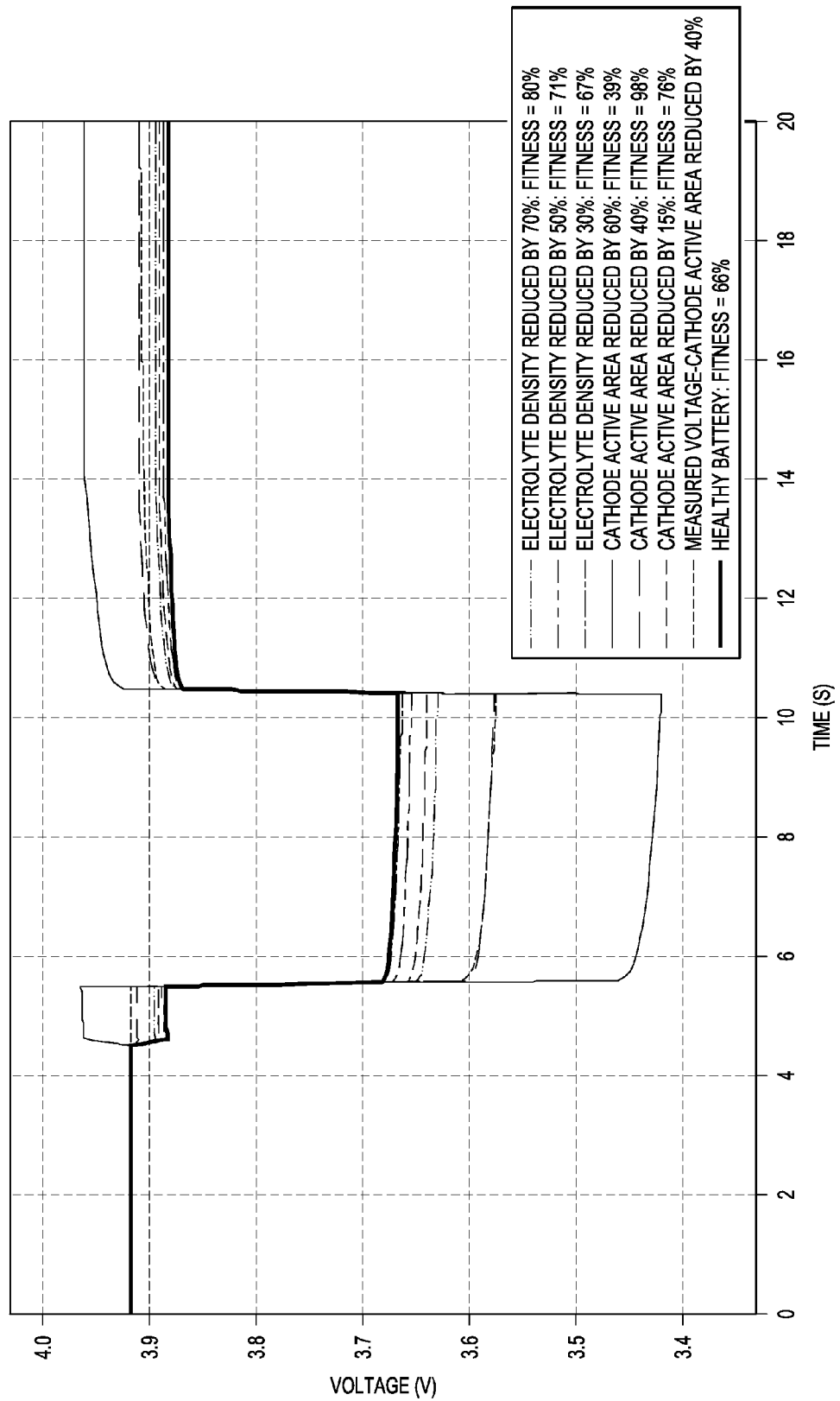
FIG. 12 is a graph comparing the measured and calculated voltages for the case of one discharging current pulse, in accordance with some embodiments.

FIG. 11 shows the case for the battery with the fault of reduced active area of the positive electrode by 40%. The current waveform of FIG. 10 is applied to the battery and convolved by the impulse responses to calculate the output voltages. All the measured and calculated voltages along with their fitness percentages are shown in FIG. 11. As is shown in FIG. 11, the calculated voltage using the impulse response corresponding to the reduced active area by 40% has the best fit to the measured voltage and because its fitness percentage is significantly different from the other fitness values, the second level of comparison is not necessary. FIG. 12 shows the same case as FIG. 11 but this time with one discharging pulse of current with the length of 12 s.

Figure 13:
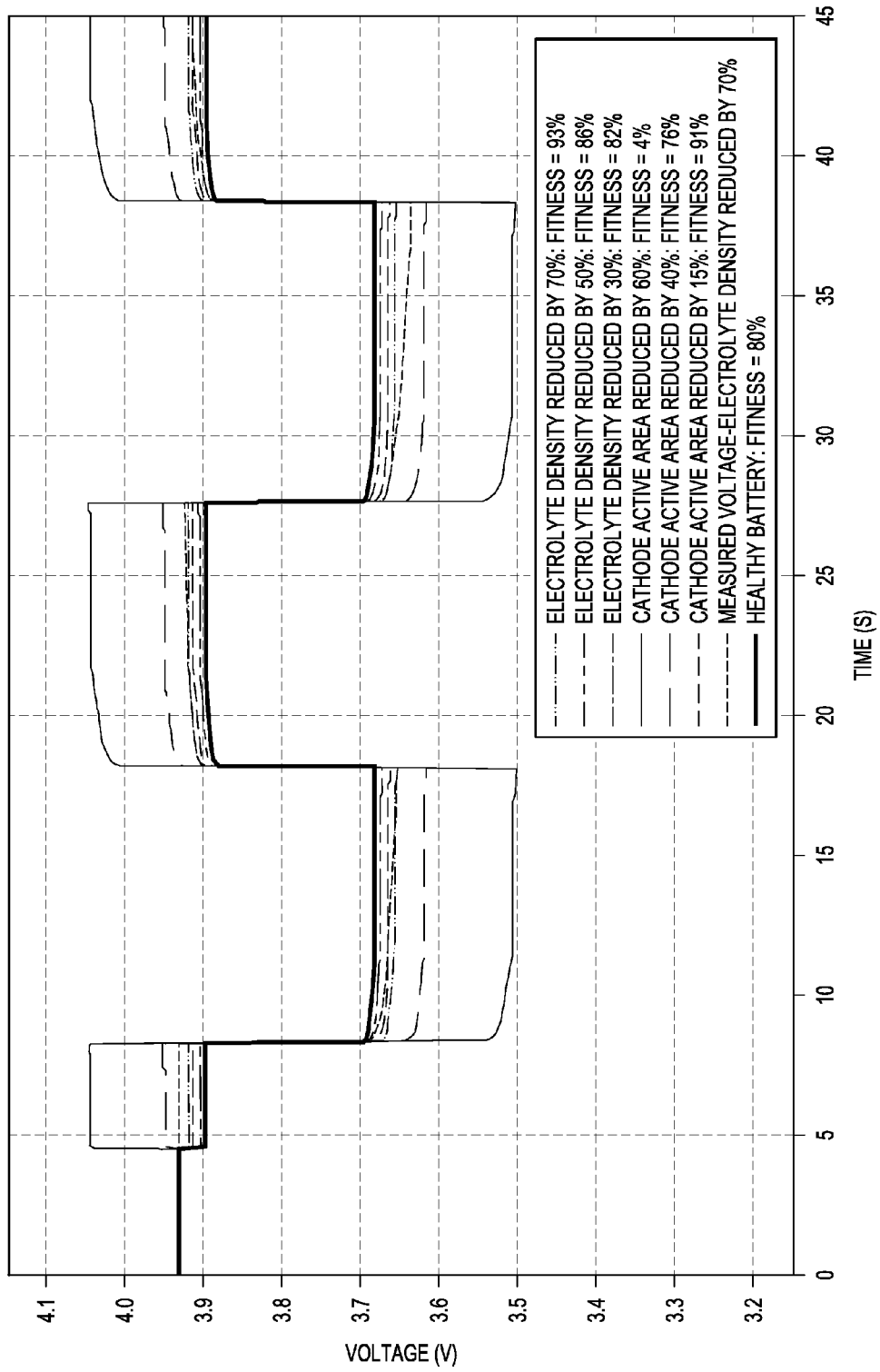
FIG. 13 is a graph showing the voltage response with the fault of electrolyte reduction by 70% after a first comparison, in accordance with some embodiments.
Figure 14:
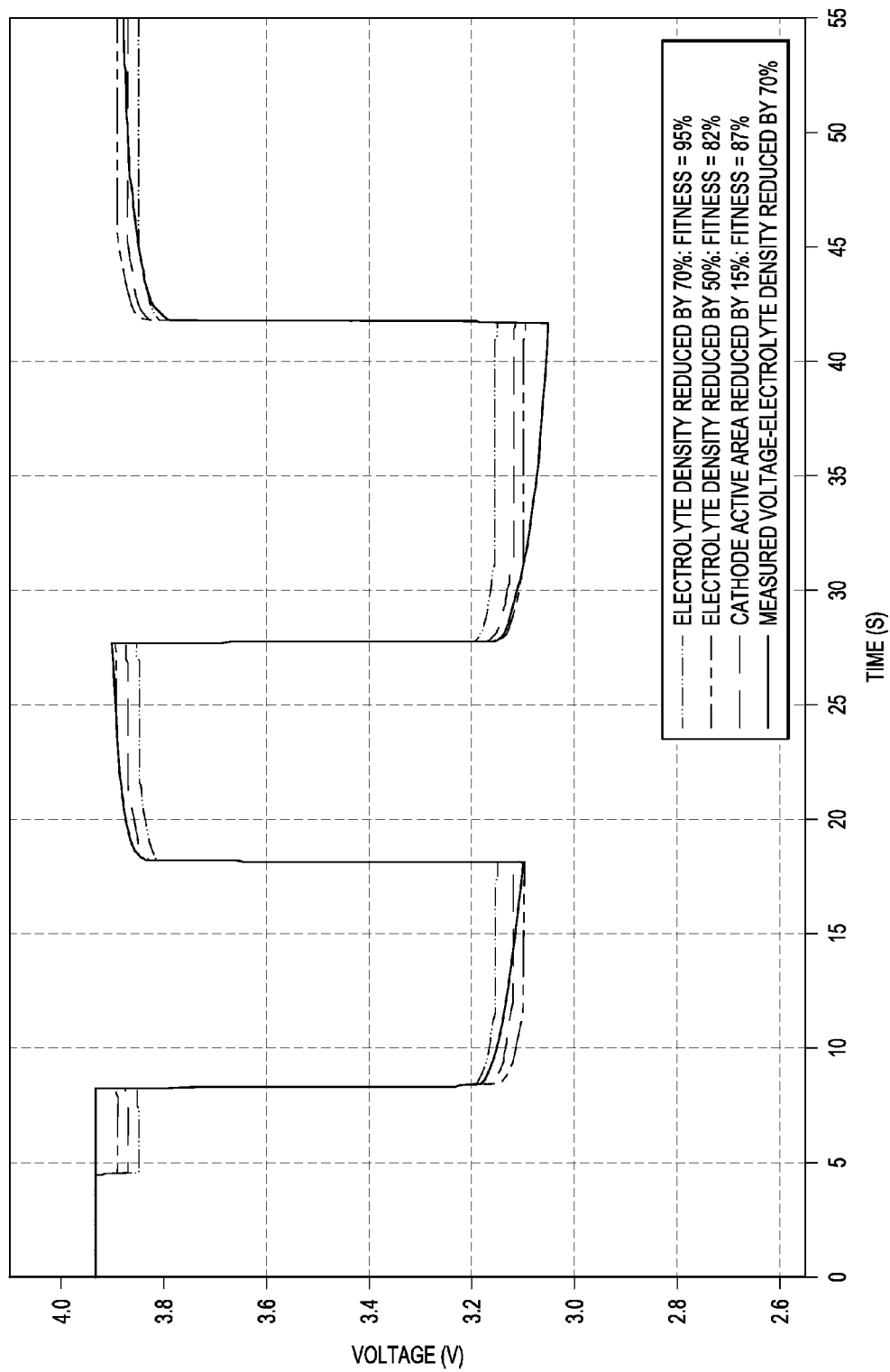
FIG. 14 is a graph showing the voltage response with the fault of electrolyte reduction by 70% after a second comparison, in accordance with some embodiments.

FIG. 13 shows the case where the battery has the fault of electrolyte density reduction by 70%. As shown in FIG. 13 the fitness value for the waveform corresponding to the reduced electrolyte density by 70% is close to the one related to the reduced active area by 5% and the one corresponding to the reduced electrolyte density by 50%. For this reason, the next level of comparison needs to be run on the impulse responses with close fitness values. FIG. 14 shows the second comparison by applying the same current waveform as FIG. 10 but with the magnitude of 3 A. The fitness value for the waveform corresponding to reduced electrolyte density by 70% is higher than the other two values. Therefore, the fault may be identified as one occurring inside the battery.

d) Experimental Results:

A new 26650 Li-Ion battery was used for experimental results. The capacity of the battery was 3.0 Ah and the experiments were done at room temperature, 25° C. Using a specific discharging pulse, the impulse response of the battery with a specific state-of-charge was identified and stored in the form of an ARMAX model using the System Identification Toolbox from MATLAB®. The calculated impulse responses for various levels of SOC are used as the battery model to calculate the output voltage.

To verify the proposed method, a new (healthy) and an aged 26650 Li-Ion batteries are selected. The health status of the aged battery is determined by the discharge test. The impulse responses corresponding to both batteries are calculated and stored in the form of ARMAX coefficients. Then, by applying any specific current waveform to these impulse responses, the expected voltages are achieved.

Figure 15:
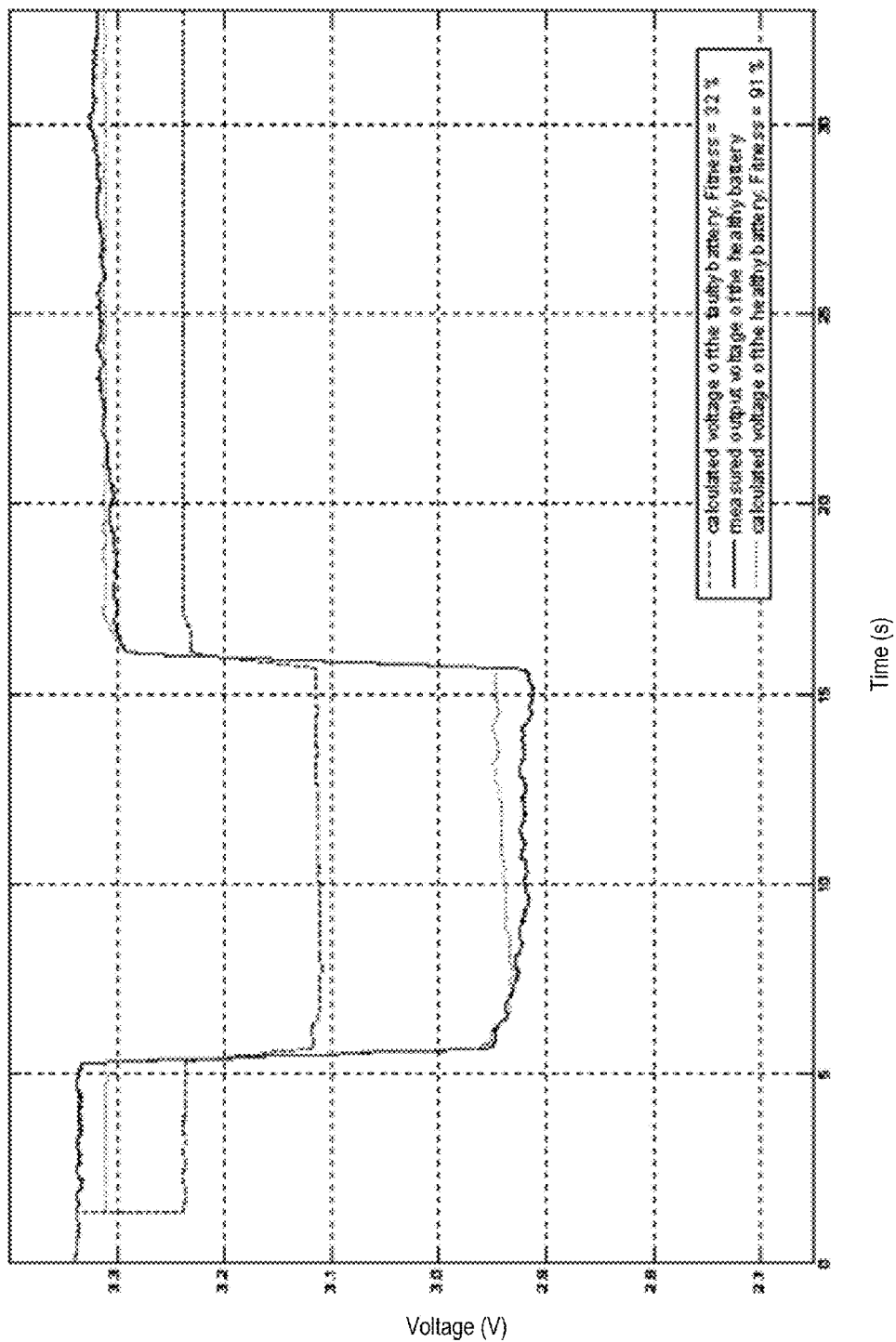
FIG. 15 is a graph showing the measured output voltage of a healthy battery and the calculated voltages of the faulty battery and the healthy battery for a single current pulse, in accordance with some embodiments.
Figure 16:
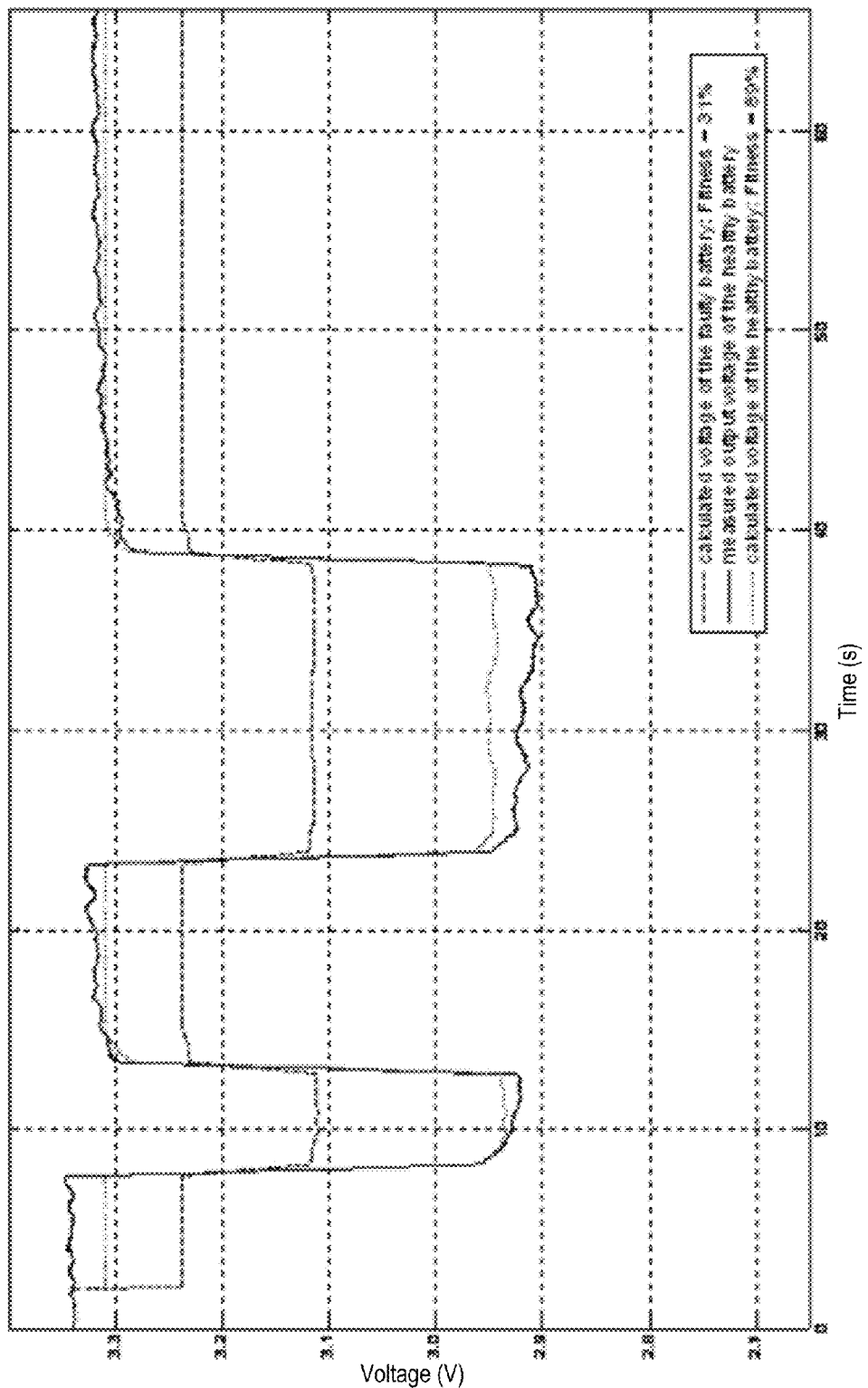
FIG. 16 is a graph showing the measured output voltage of a healthy battery and the calculated voltages of the faulty battery and the healthy battery for two current pulses, in accordance with some embodiments.

FIG. 15 and FIG. 16 show the comparison of calculated output voltages for both healthy and faulty batteries with the measured output voltage of the healthy battery. A specific current waveform is applied to the healthy battery, and then the same current waveform is applied to both impulse responses of the healthy and aged batteries. The calculated output voltages using impulse responses are compared to the measured terminal voltage of the healthy battery. It can be noted that the voltage calculated by the impulse response of the healthy battery fits the measured voltage better than the one calculated by the impulse response of the faulty battery. The test has been done for two various current waveforms, the first one has one a discharging pulse of about 10 seconds, FIG. 15, and second one contains two discharging pulses of 5 and 15 seconds, FIG. 16.

Figure 17:
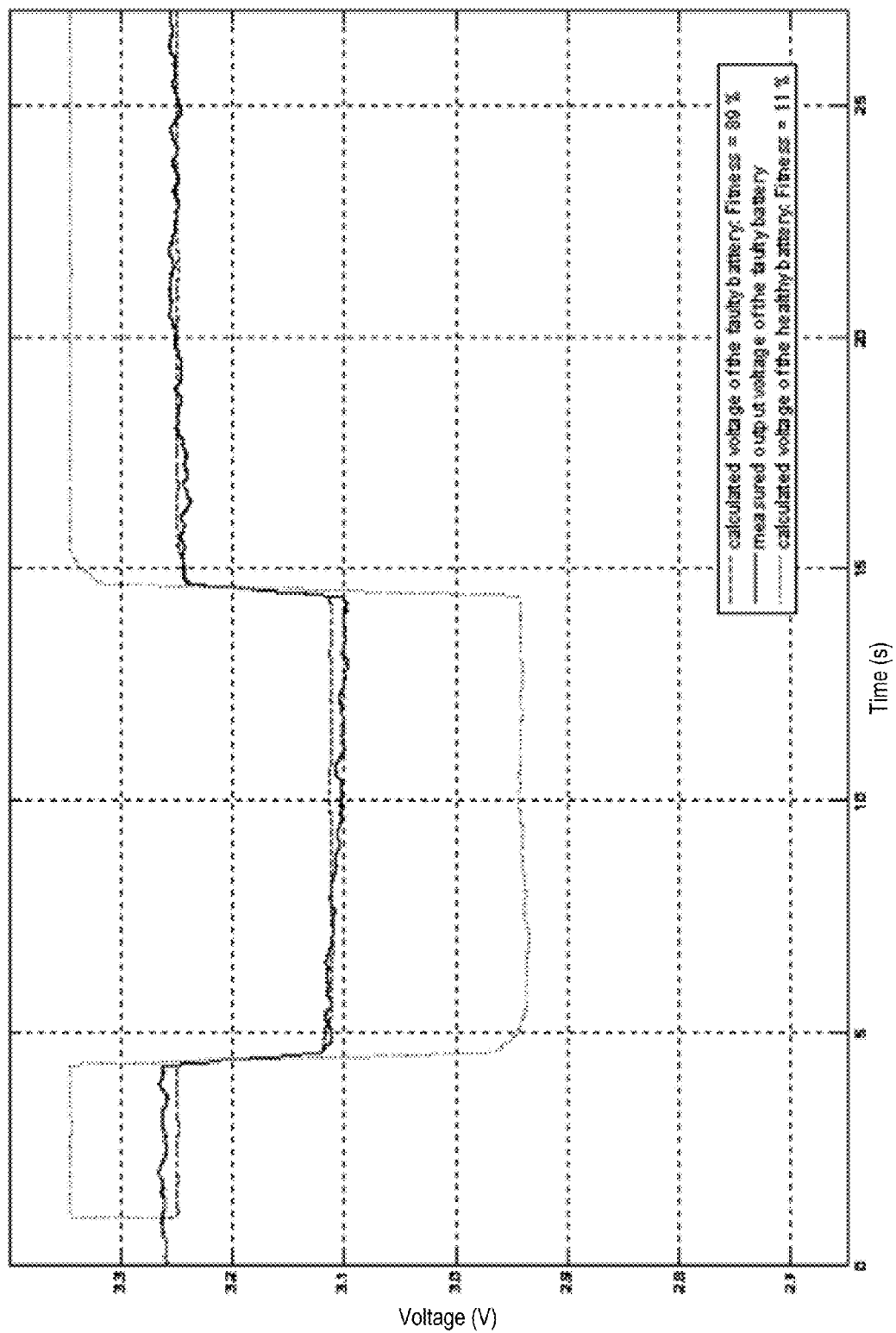
FIG. 17 is a graph showing the measured output voltage of a faulty battery and the calculated voltages of the faulty battery and the healthy battery for a single current pulse, in accordance with some embodiments.
Figure 18:
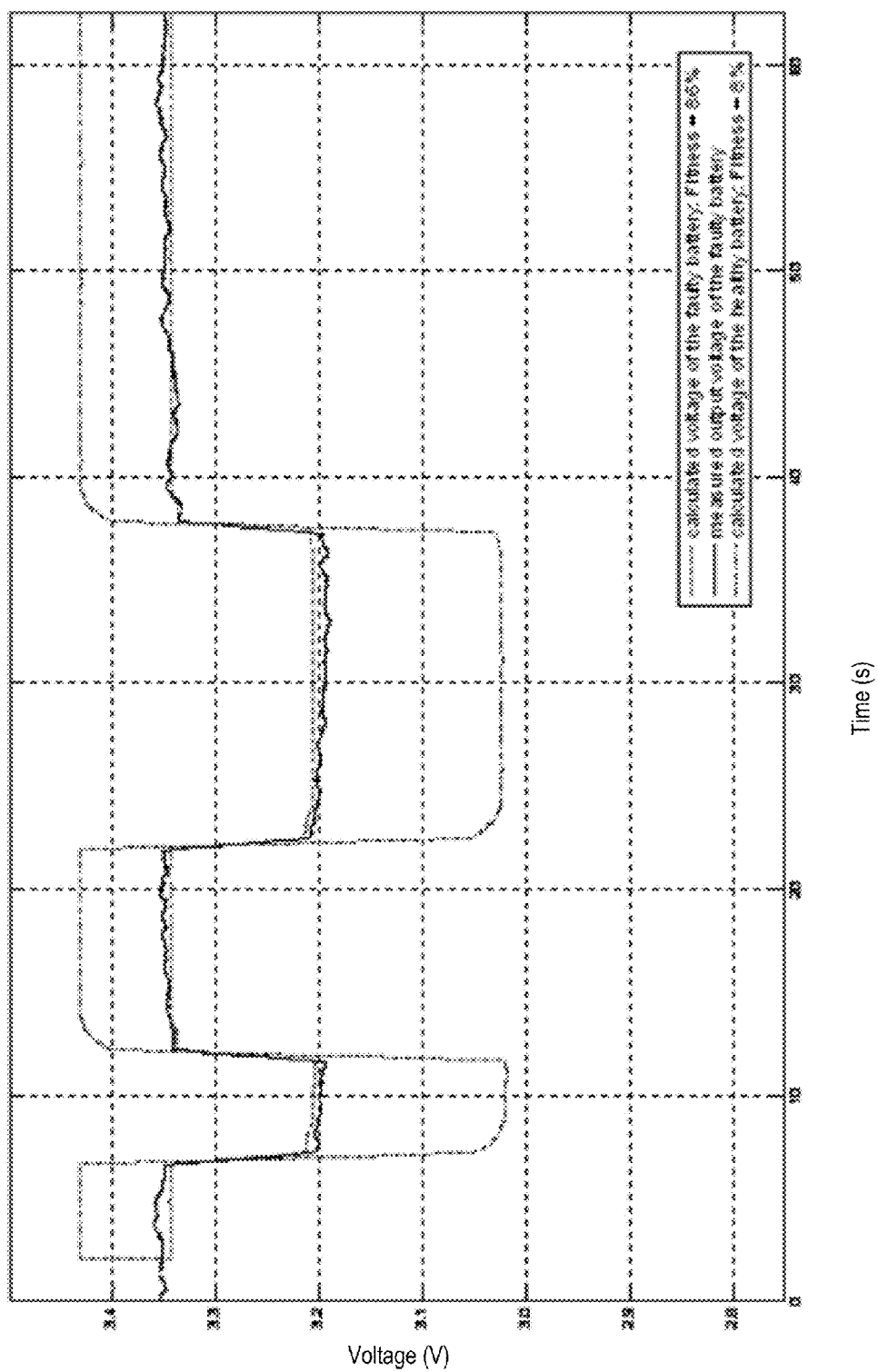
FIG. 18 is a graph showing the measured output voltage of a faulty battery and the calculated voltages of the faulty battery and the healthy battery for two current pulses, in accordance with some embodiments.

FIG. 17 and FIG. 18 show the comparison of calculated output voltages for both healthy and faulty batteries with the measured output voltage of the faulty battery. A specific current waveform is applied to the faulty battery, and then the same current waveform is applied to both impulse responses of the healthy and aged batteries. The calculated output voltages using impulse responses are compared to the measured terminal voltage of the faulty battery. It can be noted that the voltage calculated by the impulse response of the faulty battery fits the measured voltage better than the one calculated by the impulse response of the healthy battery. The test has been done for two various current waveforms, the first one has one a discharging pulse of about 10 seconds, FIG. 17, and second one contains two discharging pulses of 5 and 15 seconds, FIG. 18. The same comparison as FIGS. 15 and 16 is performed in FIGS. 17 and 18, this time for the faulty battery. As shown in FIGS. 17 and 18, the voltage calculated by the impulse response of the faulty battery has better match to the measured voltage comparing to the calculated voltage of the healthy battery.

State-of-Charge Estimation Using Impulse Response Method:

The state-of-charge (SOC) estimation method utilizes the battery impulse response concept in order to model the Li-Ion battery. The method models the battery using the impulse response method explained earlier and then it uses the dependency of the battery impulse response to its state-of-charge. Based on this relationship, the SOC of the cell may be estimated. A family of impulse responses for various levels of SOC are calculated and stored in a look-up table 1905. In other words the whole available range of SOC of the battery is being partitioned by i individual values corresponding to a specific impulse response ($h_i[k]$). The input current 830 is applied to the battery 807 experimentally and the battery voltage response 845 to that specific current is measured. Having the impulse response of the battery stored in a look up table, the terminal voltage 1910 for an arbitrary input current may be calculated by convolution 1915 of the input current 830 with all the impulse responses stored in the look-up table 1905. So, for an arbitrary input, a set of i output voltages may be achieved as expressed in equation (23):

$$v_i[k] = i[k] * h_i[k] \Rightarrow v_i[k] = \sum_{j=1}^{N} i[j] * h_i[k-j] \qquad (23)$$

Figure 19:
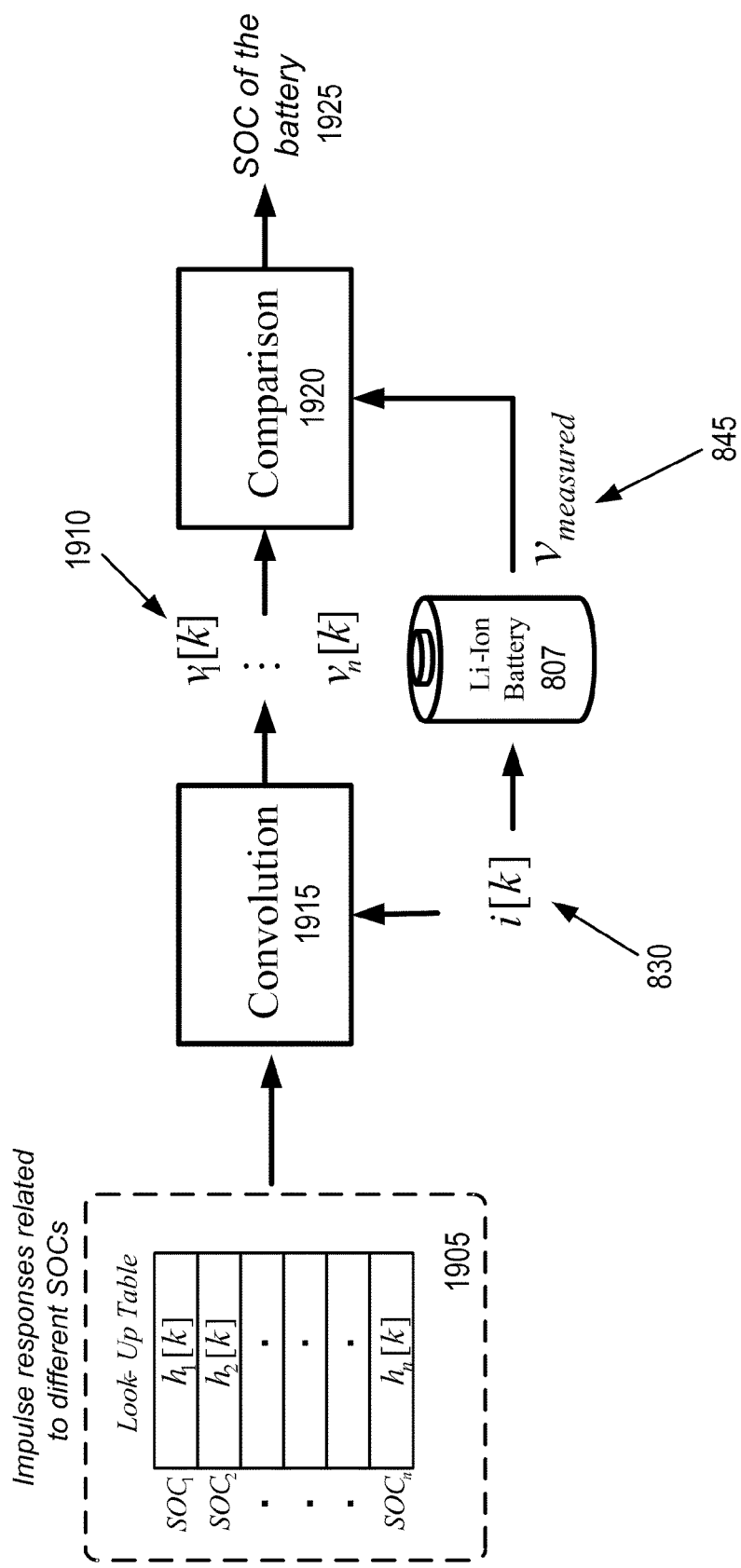
FIG. 19 is a block diagram illustrating the state-of-charge estimation method, in accordance with some embodiments.

Comparing the measured output voltage with the calculated voltages 1920 using the impulse responses from the look-up table, the proper impulse response related to the battery may be determined by using the Fitness function introduced earlier. As the SOC corresponding to each impulse response is known, the state-of-charge of the battery 1925 may be determined. FIG. 19 shows the block diagram of the state-of-charge (SOC) estimation method.

Battery Management System:

Monitoring the status of the battery is crucial for the energy storage system of Electric and Hybrid Electric Vehicles. Li-Ion batteries, specifically, need an accurate monitoring and control system because of their specific characteristics. Deep discharging and overcharging of these batteries reduces their lifetime and overcharging them may cause overheating or even explosion. The overcharge voltage is not too much higher than the fully charged voltage, which means it requires precise monitoring of voltage during the charging process in order to let the battery to be charged completely while preventing overcharging. Also their temperature should be monitored continuously to recognize possible faults and apply the appropriate treatment if necessary.

Figure 20:
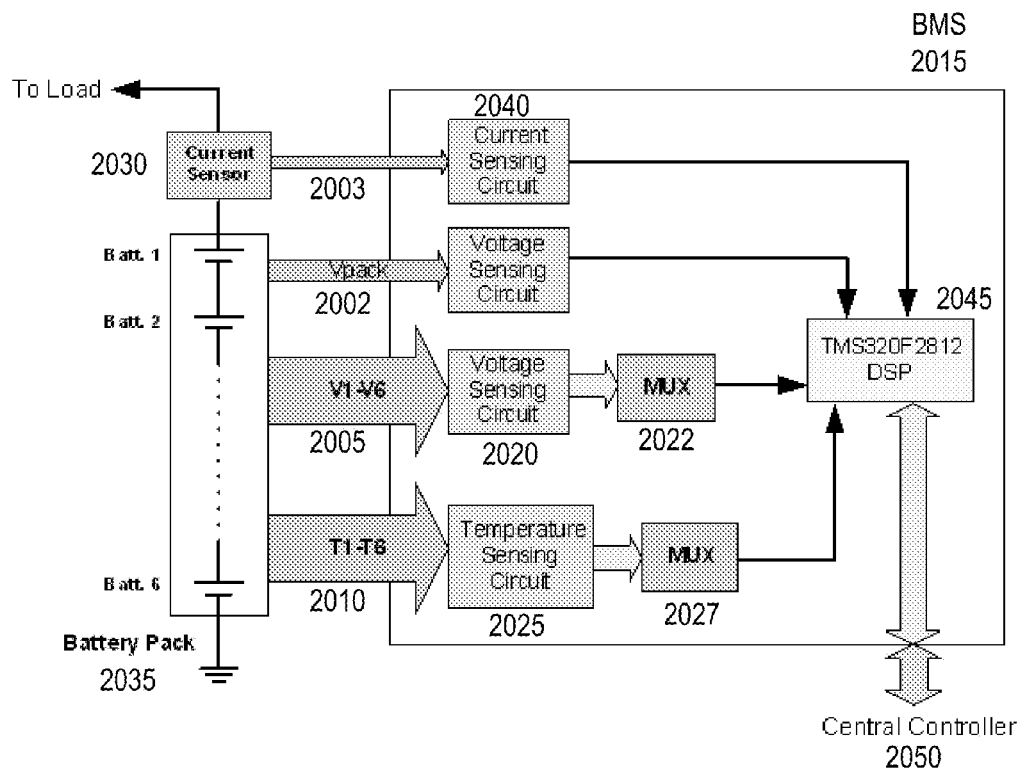
FIG. 20 is a block diagram of the battery management system, in accordance with some embodiments.

In some embodiments, a monitoring circuit monitors the temperatures and voltages of a battery pack comprising six 18650 Li-Ion batteries which are connected in series. The circuit measures the individual voltages and temperatures of the six cells and also the voltage 2002 and current 2003 of the battery pack 2035. FIG. 20 shows the block diagram of the monitoring circuit. The six individual signals related to the voltages 2005 and temperatures 2010 of the batteries are sent to the Battery Management System (BMS) board 2015. The corresponding sensing circuits measure the voltages 2020 and the temperatures 2025. Because of the limitations in analog (A/D) inputs of the DSP controller, two individual 8 to 1 multiplexers are used to select one signal per time out of 12 values of voltage and temperature (one 8 to 1 multiplexer for voltage 2022 and another one for temperature 2027). A current sensor 2030 is mounted on the way of the outgoing current from the battery pack 2035 which along with the current sensing circuit 2040 on the battery monitoring board creates specific signals based on the magnitude of the current. The produced signal is sent to the DSP board 2045 and the corresponding current magnitude is calculated and transferred to the central controller 2050.

Figure 21:
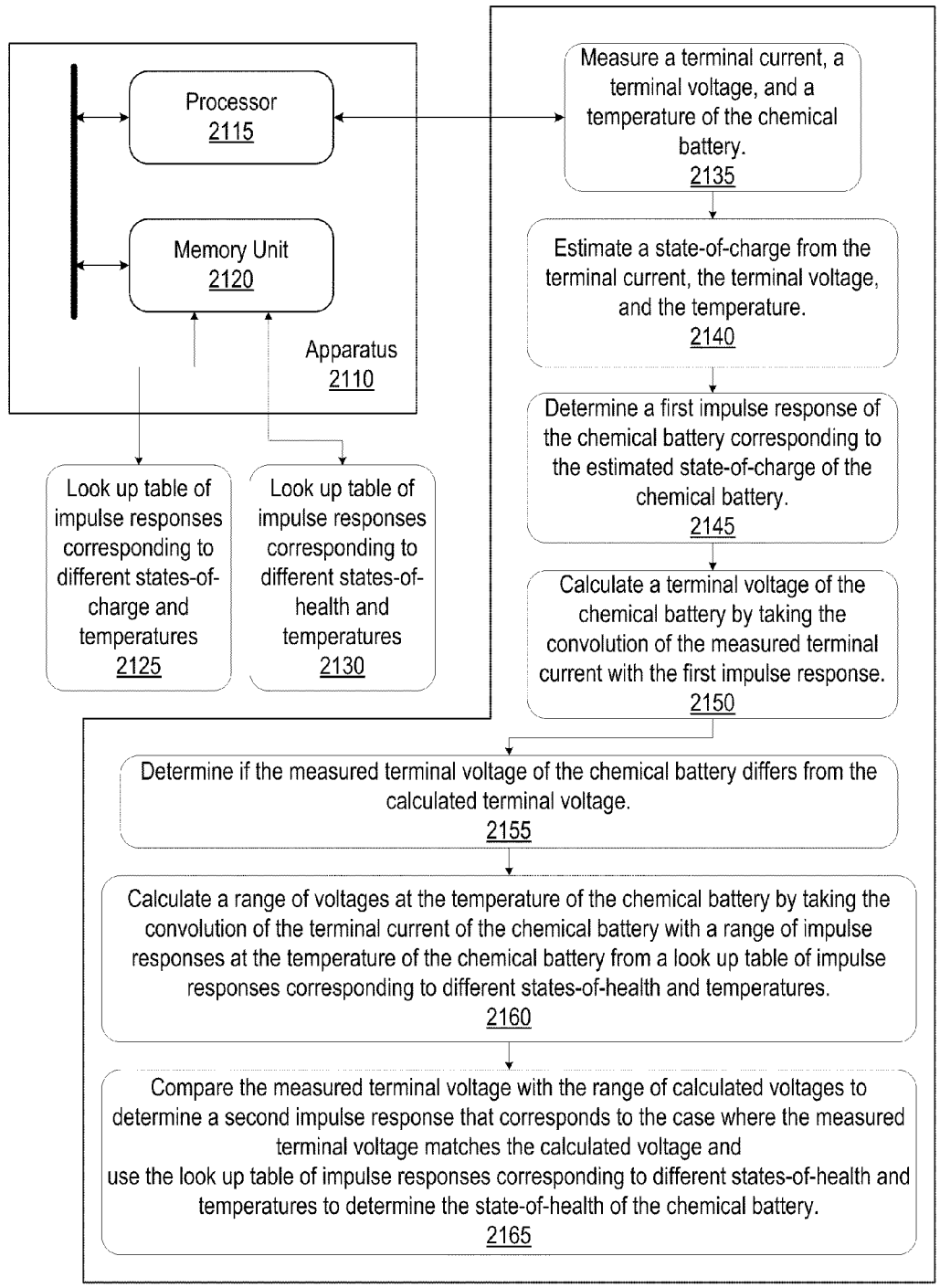
FIG. 21 is a block diagram illustrating an apparatus for estimating a state-of-health in an online chemical battery, in accordance with some embodiments.

FIG. 21 is a block diagram illustrating an apparatus for estimating a state-of-health in an online chemical battery, in accordance with some embodiments.

In some embodiments, an apparatus 2110 comprises a processor 2115 and a memory unit 2120. Processor 2115 is configured to perform computations and general control operations and memory unit 2120 is configured to store the look up table of impulse responses corresponding to different states-of-charge and temperatures 2125 and the look up table of impulse responses corresponding to different states-of-health and temperature 2130. The computations and the general control operations of the processor 2115 are to measure a terminal current, a terminal voltage, and a temperature of the chemical battery 2135, estimate a state-of-charge from the terminal current, the terminal voltage, and the temperature 2140, determine a first impulse response of the chemical battery corresponding to the estimated state-of-charge of the chemical battery 2145, calculate a terminal voltage of the chemical battery by taking the convolution of the measured terminal current with the first impulse response 2150, determine if the measured terminal voltage of the chemical battery differs from the calculated terminal voltage 2155, calculate a range of voltages at the temperature of the chemical battery by taking the convolution of the terminal current of the chemical battery with a range of impulse responses at the temperature of the chemical battery from a look up table of impulse responses corresponding to different states-of-health and temperatures 2160, and compare the measured terminal voltage with the range of calculated voltages to determine a second impulse response that corresponds to the case where the measured terminal voltage matches the calculated voltage and use the look up table of impulse responses corresponding to different states-of-health and temperatures to determine the state-of-health of the chemical battery 2165.

In light of the principles and example embodiments described and illustrated herein, it will be recognized that the example embodiments can be modified in arrangement and detail without departing from such principles. Also, the foregoing discussion has focused on particular embodiments, but other configurations are contemplated. In particular, even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments.

Similarly, although example processes have been described with regard to particular operations performed in a particular sequence, numerous modifications could be applied to those processes to derive numerous alternative embodiments of the present invention. For example, alternative embodiments may include processes that use fewer than all of the disclosed operations, processes that use additional operations, and processes in which the individual operations disclosed herein are combined, subdivided, rearranged, or otherwise altered.

This disclosure also described various benefits and advantages that may be provided by various embodiments. One, some, all, or different benefits or advantages may be provided by different embodiments.

In view of the wide variety of useful permutations that may be readily derived from the example embodiments described herein, this detailed description is intended to be illustrative only, and should not be taken as limiting the scope of the invention. What is claimed as the invention, therefore, are all implementations that come within the scope of the following claims, and all equivalents to such implementations.

What is claimed is:

1. An apparatus, comprising:
a battery;
a state-of-charge (SOC) estimator configured to receive information from the battery;
a first look up table coupled to the SOC estimator, the first look up table comprising impulse responses related to different states-of-charge and temperatures for a healthy battery;
a second look up table receiving a measured temperature of the battery, the second look up table comprising impulse responses corresponding to different faults, wherein the second look up table comprises impulse responses related to different temperatures for an unhealthy battery;
a first convolution device configured to access the first look up table and communicatively coupled to a pattern recognition device, wherein the pattern recognition device is configured to compare waveforms;
a second convolution device configured to access the second look up table and communicatively coupled to the pattern recognition device; and
the pattern recognition device, wherein the pattern recognition device is further configured to receive information from the battery, the first convolution device, and the second convolution device, and wherein the pattern recognition device receives a calculated voltage of the battery, a measured voltage of the battery, and a calculated range of voltages and, based, at least in part, on the comparison of waveforms, outputs an indication of at least one of: a state-of-health of the battery, a possible fault of the battery, and a lifetime of the battery.

2. The apparatus of claim 1, wherein the SOC estimator receives a measured terminal current of the battery, the measured temperature of the battery, and the measured voltage of the battery, and the SOC estimator outputs a state-of-charge of the battery.

3. The apparatus of claim 1, wherein the first convolution device receives an impulse response and outputs the calculated voltage of the battery to the pattern recognition device.

4. The apparatus of claim 1, wherein the second convolution device receives a range of impulse responses from the second look up table and outputs the calculated range of voltages.

* * * * *